United States Patent

Shimada et al.

(10) Patent No.: US 6,416,939 B1
(45) Date of Patent: Jul. 9, 2002

(54) METHOD FOR NEGATIVE IMAGE RECORDING

(75) Inventors: Kazuto Shimada; Kazuto Kunita, both of Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/558,227

(22) Filed: Apr. 26, 2000

(30) Foreign Application Priority Data

Apr. 28, 1999 (JP) .......................................... 11-122984

(51) Int. Cl.$^7$ ................................................. G03F 7/26
(52) U.S. Cl. ................... 430/325; 430/281.1; 430/302; 430/288.1; 430/914; 430/944
(58) Field of Search ...................... 430/281.1, 288.1, 430/325, 914, 944, 302, 171

(56) References Cited

U.S. PATENT DOCUMENTS

| 3,556,791 | A | * | 1/1971 | Suzuki et al. | ................. | 96/35.1 |
| 5,658,708 | A | | 8/1997 | Kondo | | |
| 5,837,421 | A | * | 11/1998 | Kanda et al. | ............ | 430/281.1 |
| 6,280,905 | B1 | * | 8/2001 | Koshimura et al. | ...... | 430/281.1 |

FOREIGN PATENT DOCUMENTS

| EP | 0 854 388 A2 | 7/1998 |
| EP | 0 919 868 A1 | 6/1999 |
| JP | 11-15155 | 1/1999 |

OTHER PUBLICATIONS

U. Schaedeli et al., "1,3–Dioxolyl Acetals as Powerful Crosslinkers of Phenolic Resin", Proc. SPIE, vol. 1925, Mar. 1993, 109–119.*

* cited by examiner

Primary Examiner—Rosemary Ashton
(74) Attorney, Agent, or Firm—Burns, Doane, Swecker & Mathis, LLP

(57) ABSTRACT

The invention provides a negative type image recording material containing (A) a compound having at least one group represented by general formula (1) below (where $Ar^1$ represents an arylene group, and $R^1$ represents hydrogen or an alkyl group having 1~4 carbon atoms, (B) a polymer capable of reacting with compound (A) in the presence of acid, and (C) a compound that generates acid in response to supply of energetic radiation, an electron beam, or heat. The negative type image recording material has excellent sensitivity and enables direct image recording from digital data supplied by a computer or the like.

general formula (1)

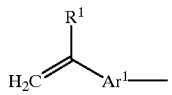

15 Claims, No Drawings

METHOD FOR NEGATIVE IMAGE RECORDING

BACKGROUND OF THE INVENTION

1. Field of the Invention

The present invention relates to a negative type image recording material that can be used as a printing plate for lithographic printing and as a photoresist. In particular, the present invention relates to a negative type image recording material that is ideal for use as a printing plate for lithographic printing enabling so-called direct plate making, in which direct plate making from digital signals supplied from a computer or the like can be achieved using lasers of various types.

2. Description of the Related Art

Solid state lasers, semiconductor lasers, and gas lasers that are capable of emitting UV light, visible light and infra-red light of wavelengths from 300 nm to 1200 nm which are of high output and small size have become easily obtainable; such lasers are extremely useful as recording light sources in direct plate making from digital data supplied by a computer, for example. Various types of recording material that respond to these various types of laser light are being studied.

Firstly, as a material that is capable of recording using an infra-red laser of photosensitive wavelength 760 nm or more, Japanese Patent Application Laid-Open (JP-A) No. 10-203037 discloses an image recording material comprising a polymer having a heterocyclic group, a cross-linking agent, acid generating agent, and infra-red absorbent. Although the sensitivity and stability over time of this image recording material have been somewhat improved, further improvement of its performance is desired.

Secondly, as recording materials capable of responding to laser light of short wavelength or visible laser light of 300 nm~700 nm, most attention has been attracted by recording materials of the radical polymerization type, and various types of these are being studied. However, since, with recording materials of the radical polymerization type, radical polymerization is employed as the image forming mechanism, it is necessary to prevent interference with the progress of radical polymerization by cutting off oxygen from the sensitive material. A method of reducing interference of oxygen with polymerization and achieving higher sensitivity of the sensitive material is to provide an oxygen-impermeable oxygen cut-off layer at the surface of the sensitive material; for this oxygen cut-off layer, usually, polyvinyl alcohol etc. is employed. However, from the point of view of ease of handling in the developing step etc. after plate making, as well as reproducibility of the image, it is preferable not to provide such an oxygen cut-off layer.

Thirdly, regarding photoresist material of the electron beam-responsive type, in recent years research is being prosecuted vigorously, against the background of for example an increasing degree of integration of integrated circuits and even in semiconductor substrate manufacture for VLSI chips etc., where it is becoming necessary to process very fine patterns of lead width under half a $\mu$m. In order to satisfy this requirement, the wavelengths employed in the exposure devices used in photolithography are being made increasingly shorter, far UV light or excimer or laser light (XeCl, KrF, ArF etc.) is being studied, and the formation of very fine patterns by electron beams is also being studied. In particular, electron beams are positioned [to fulfill the role of] light sources in next-generation or post-next generation pattern-forming technology, so the development is desired of negative type photoresist materials, which are highly sensitive to electron beams and whereby there can be achieved a fine high-resolution pattern having a rectangular profile.

In electron-beam lithography, the photoresist material is photosensitized by emission of energy in a step in which an accelerated electron beam causes collision scattering with the atoms constituting the photoresist material. If an electron beam is employed that has been subjected to a high degree of acceleration, its linearity is increased and the effects of electron scattering are reduced. As a result, a pattern of rectangular shape can be formed with high resolution. On the other hand, high acceleration causes the problem that transmissivity of the electron beam is increased, reducing sensitivity. Thus, in electron beam lithography, sensitivity and resolution and/or storage stability are in a trade-off relationship and the problem is to achieve both of these at the same time.

The present situation regarding recording materials that are responsive to laser light of various types is that a fully satisfactory product has not yet been obtained. Methods of image recording involving an acid-catalyzed cross-linking system, in particular, utilizing cationic polymerization, continue to attract attention as methods of image recording capable of solving the problems referred to above. Regarding image recording materials utilizing cationic polymerization, photosensitive compositions employing an iodonium salt and cationic polymerizable compound are proposed in for example JP-A No. 3-68950 and U.S. Pat. No. 4,264,703. Also, JP-A No. 59-147001 and U.S. Pat. No. 4,442,197 propose photo-hardening compositions using a sulfonium salt and a cationic polymerizable epoxy compound or vinyl ether compound. Furthermore, JP-A No. 59-180543 proposes a photosensitive composition using an oxysilane, oxetane, thiirane, or thietane ring-containing compound, while JP-A No. 2-43202 proposes a hardenable composition etc. using a pyridinium salt as initiator. However, none of these image recording materials show sufficient stability over time.

An object of the present invention is to solve the above problem. Specifically, an object thereof is to provide a negative type image recording material whereby an image can be directly recorded from digital data supplied by for example a computer, by recording using a short-wavelength laser, visible laser, solid-state laser or semiconductor laser that emits infra-red rays, gas laser or electron beam. A further object is to provide a negative type image recording material that shows excellent sensitivity when employed as a printing plate, high resistance to printing when employed in printing, and has excellent storage stability. Yet a further object is to provide a negative type image recording material that shows high sensitivity when used as a photoresist material and also excellent resolution and storage stability.

SUMMARY OF THE INVENTION

As a result of intensive study of negative type image recording materials, the present inventors discovered that the foregoing problems could be solved by employing, together with a compound having a specific styrene group, as a binder, a polymer capable of bonding with the styrene group in the presence of acid, and thereby succeeded in perfecting the present invention.

Specifically, the present invention provides in a negative type image recording material containing (A) a compound having at least one group represented by general formula (1) below, (B) a polymer capable of reacting with compound (A) in the presence of acid, and (C) a compound that generates acid in response to energetic radiation, an electron beam, or heat.

general formula (1)

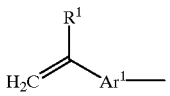

In general formula (1) Ar$^1$ represents an arylene group, and R$^1$ represents a hydrogen atom or an alkyl group of carbon number 1~6.

The negative type image recording material according to the present invention is characterized by using as cross-linking agent a compound having at least one group represented by general formula (1) above. Catalytically, in the presence of a small quantity of acid, this styrene group performs a cross-linking reaction with the binder constituted by polymer (B); it is believed that, as a result of this cross-linkage of the binder, benzene rings etc., which are hydrophobic groups, are inserted into the binder, increasing the hydrophobic character of the exposure region, and increasing resistance to printing and resolution. Also, it is believed that, since these styrene groups are cationically polymerizable, such styrene groups polymerize under acid catalysis, with a cross-linkage reaction with the binder taking place at the polymerization terminals; as a result, the film strength of the exposure region is further improved, and resistance to printing, and resolution are improved. Also, it is believed that since these styrene groups are comparatively stable to heat, the storage stability of the negative type image recording material containing these is further improved.

However, it is to be understood that the mechanisms described above are merely mechanisms inferred by the inventors etc. and the scope of the present invention is not to be construed as limited by such mechanisms.

DETAILED DESCRIPTION OF THE PREFERRED EMBODIMENTS

The various constituents (A)~(C) referred to above are described below.

(A) Is a Compound Having At Least One Group Represented by the General Formula (1) Below (Hereinbelow it Will be Referred to Simply as "Compound (A)".)

general formula (1)

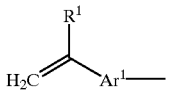

Compound (A), in the negative type image recording material of the present invention, functions as a cross-linking agent of the binder. In general formula (1), Ar$^1$ represents an arylene group. Examples of rings constituting an arylene group include benzene rings, fused rings formed by two or three benzene rings, and fused rings of a benzene ring and a 5-member unsaturated ring. Specific examples of these arylene groups include carbon ring type divalent groups such as benzene rings, naphthalene rings, anthracene rings, phenanthrene rings, indene rings, acenaphthylene rings, and fluorene rings. Also, apart from divalent groups of the carbon-ring type referred to above, the arylene rings include heterocyclic divalent groups. Specific examples include rings of carbon number 3~20 containing 1~5 hetero atoms, specifically, pyridine rings, furan rings, and heterocyclic divalent groups in which a heterocyclic ring is fused with a carbon ring such as a benzene ring, such as quinoline rings, benzofuran rings, thioxanthone rings, carbazole rings, indole rings, benzofuran rings, and imidazole rings.

Ar$^1$ may have a substituent group; example substitute groups include monovalent non-metallic atomic groups other than hydrogen. Examples of substituent groups include: halogen atoms (F, Cl, Br, I), hydroxy groups, cyano groups, nitro groups, formyl groups, alkyl groups consisting of straight-chain groups of carbon number 1~12, branched groups or cyclic groups, alkenyl groups, alkynyl groups, carbonyl groups, alkoxy groups, aryloxy groups, carbonyl groups, alloxythio groups, arylthio groups, amino groups, phenyl groups, naphthyl groups, sulfoxy groups, sulfonyl groups, carbamoyl groups, sulfamoyl groups, and substituents obtained by combining these substituents. Specific examples of these substituents are: n-butyl groups, s-butyl groups, t-butyl groups, dodecyl groups, cyclohexyl groups, trifluoromethyl groups, chloromethyl groups, bromophenyl groups, mesityl groups, vinyl groups, cinnamyl groups, cyclopentane groups, 1-propenyl groups, ethynyl groups, acetyl groups, carboxyphenyl groups, acetyloxy groups, ethoxycarbonyl groups, methoxy groups, n-butoxy groups, methylthiomethyl groups, phenoxy groups, diethylamino groups, diphenylamino groups, methylphenylamino groups, methoxymethyl groups, benzyloxy groups, acetylamino groups, acetylaminoethyl groups, methoxysulfonyl groups, ethylsulfoxy groups, phenylsulfonyl groups, or carbamoyl-methyl groups. Preferred substituents among these substituents are alkyl groups, alkenyl groups, alkynyl groups, halogen atoms, hydroxy groups, and alkoxy groups.

When representing Ar$^1$-substituted arylene groups, as Ar$^1$ there may be mentioned divalent groups such as: biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxy phenyl, allyloxyphenyl, phenoxyphenyl, methylthiophenyl, tolylthiophenyl, ethylaminophenyl, diethylaminophenyl, morpholinophenyl, acetyloxyphenyl, benzoyloxyphenyl, N-cyclohexylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methyl carbamoylphenyl, N,N-dipropylcarbamoylphenyl, N-(methoxyphenyl)carbamoylphenyl, N-methyl-N-(sulfophenyl)carbamoylphenyl, sulfophenyl, sulfonate phenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonate phenyl, diethyl-phosphonophenyl, diphenylphosphonophenyl, methylphosphonophenyl, methylphosphonate phenyl, tolylphosphonophenyl, tolylphosphonate phenyl, allylphen-yl groups, 1-propenylmethylphenyl groups, 2-butenylphenyl groups, 2-methylallylphenyl, 2-methylpropenylphenyl, 2-propenylphenyl, 2-butenylphenyl, or 3-butenylphenyl etc.

As Ar$^1$, an unsubstituted arylene group is preferable; in particular, a phenylene group is preferable.

In the above general formula (1), R$^1$ represents hydrogen or an alkyl group of carbon number 1~6. The alkyl group can be straight-chain or branched. Methyl and ethyl are preferable.

If compound (A) is of the multi-functional type possessing two or more groups represented by general formula (1), the number of cross-linkage points with the binder is increased, causing an enormous increase in the efficiency of the cross-linking reaction, and improving sensitivity and resistance to printing; this is therefore desirable. It is further desirable that it should be a compound possessing three or more of these groups.

Of these, compounds represented by the following general formula (2) are preferable.

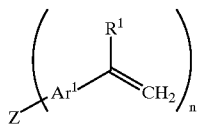

general formula (2)

In general formula (2), $Ar^1$ and $R^1$ have the same meaning as in general formula (1), and preferred examples are the same. n indicates an integer which may be selected from 1~20. Preferably n is 2 or more, and even more preferably n is 3 or more. Z is a divalent linkage group, and is a group selected from the set of divalent groups given below, or is a n-valent group containing divalent groups representing a combination of two or more groups selected from the following set of divalent groups. Although there is no particular restriction regarding the position of substitution of the $Ar^1$-substituted Z— and $CH_2$=$CR^1$—, from the point of view of ease of synthesis, it is preferable that the $CH_2$=$CR^1$— should be in the para position with respect to the Z—.

When n is 1, Z represents a substituent of a benzene ring.

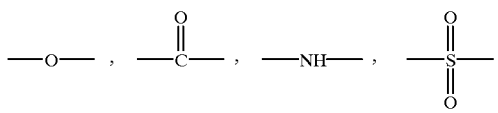

Specific examples of compounds that may suitably be used as compound (A) may be conveniently classified in accordance with their structural characteristics in groups I~VI, and these groups may be further divided into group (a) having no hetero atom and group (b) having a hetero atom indicated below. However, compound (A) to be employed in the present invention is not restricted to these.

Group I
Group I-(a)

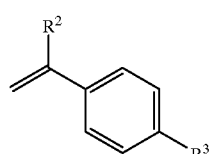

(i)

| I-(a)-(i)- | $R^2$ | $R^3$ |
|---|---|---|
| 1 | —H | —H |
| 2 | —H | —Me |
| 3 | —H | —$^tBu$ |
| 4 | —H | —$(CH_2)_{11}CH_3$ |
| 5 | —H | —CH=$CH_2$ |
| 6 | —Me | —H |

-continued

| 7 | —Me | —C(CH$_3$)=CH$_2$ |
|---|---|---|
| 8 | —Me | —Me |
| 9 | —Me | —$^tBu$ |
| 10 | —Et | —H |
| 11 | —$^nHex$ | —H |

(ii)

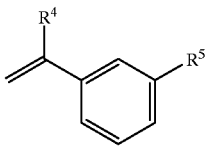

| I-(a)-(ii)- | $R^4$ | $R^5$ |
|---|---|---|
| 1 | —H | —Me |
| 2 | —H | —$^tBu$ |
| 3 | —H | —CH=$CH_2$ |
| 4 | —Me | —Me |
| 5 | —Me | —CH(CH$_3$)$_2$ |
| 6 | —Me | —CH=$CH_2$ |

(iii)

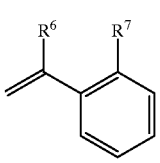

| I-(a)-(iii)- | $R^6$ | $R^7$ |
|---|---|---|
| 1 | —H | —Me |
| 2 | —H | —Et |
| 3 | —H | —CH=$CH_2$ |
| 4 | —Me | —Me |

Group I-(b)

(i)

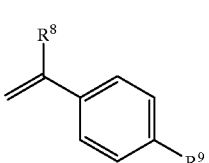

| I-(b)-(i)- | $R^8$ | $R^9$ |
|---|---|---|
| 1 | —H | —OH |
| 2 | —H | —O—$^nBu$ |
| 3 | —H | —O—CH(CH$_3$)$_2$ |
| 4 | —H | —OC(CH$_3$)—C$_2$H$_5$ |
| 5 | —H | —O—$^tBu$ |
| 6 | —H | —COCH$_3$ |
| 7 | —H | —SO$_2$OCH$_3$ |
| 8 | —H | —CO$_2$CH$_3$ |
| 9 | —H | —OSO$_2$—$^nBu$ |
| 10 | —H | —OCO—Ph |
| 11 | —H | —COSCH$_3$ |
| 12 | —H | —NH$_2$ |
| 13 | —H | —NHCONH—$^nBu$ |
| 14 | —H | —OCONH-c-Hex |
| 15 | —H | —CH$_2$O-n-Hex |
| 16 | —H | —CH$_2$S—Et |

-continued

| | | |
|---|---|---|
| 17 | —H | —CH$_2$OCO—Ph |
| 18 | —H | —Cl |
| 19 | —H | —F |
| 20 | —Me | —OH |
| 21 | —Me | —CH$_2$O—$^n$Bu |
| 22 | —Me | —COCH$_3$ |
| 23 | —Me | —NHCO—Ph |
| 24 | —Me | —Cl |
| 25 | —Me | —Br |

(ii)

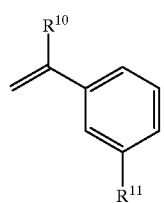

| I-(b)-(ii)- | R$^{10}$ | R$^{11}$ |
|---|---|---|
| 1 | —H | —OH |
| 2 | —H | —O—$^n$Bu |
| 3 | —H | —COCH$_3$ |
| 4 | —H | —NHCO—Ph |
| 5 | —H | —CH$_2$O—Et |
| 6 | —H | —Cl |
| 7 | —Me | —OH |
| 8 | —Me | —O—CH$_2$CH(CH$_3$)$_2$ |
| 9 | —Me | —F |
| 10 | —Me | —Br |

(iii)

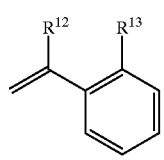

| I-(b)-(iii)- | R$^{12}$ | R$^{13}$ |
|---|---|---|
| 1 | —H | —OH |
| 2 | —H | —NH$_2$ |
| 3 | —H | —OCOCH$_3$ |
| 4 | —H | —Br |
| 5 | —Me | —OH |
| 6 | —Me | —NHCO—$^n$Bu |
| 7 | —Me | —F |

(iv)

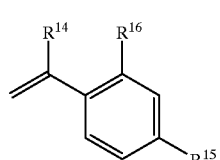

| I-(b)-(iv)- | R$^{14}$ | R$^{15}$ | R$^{16}$ |
|---|---|---|---|
| 1 | —H | —OH | —COCH$_3$ |
| 2 | —H | —Cl | —OH |
| 3 | —H | —Br | —NH$_2$ |
| 4 | —H | —COOH | —COCH$_3$ |
| 5 | —Me | —OH | —COCH$_3$ |

(v)

| I-(b)-(v)- | R$^{17}$ | R$^{18}$ | R$^{19}$ |
|---|---|---|---|
| 1 | —H | —OH | —F |
| 2 | —H | —COCH$_3$ | —CH$_3$ |
| 3 | —H | —Cl | —NHCOCH$_3$ |

(vi)

| I-(b)-(vi)- | R$^{20}$ | R$^{21}$ | R$^{22}$ |
|---|---|---|---|
| 1 | —H | —CH$_2$OH | —CH$_2$OH |
| 2 | —H | —F | —F |
| 3 | —H | —F | —CH$_3$ |

(vii)

| I-(b)-(vii)- | R$^{23}$ | R$^{24}$ | R$^{25}$ |
|---|---|---|---|
| 1 | —H | —OH | —OH |
| 2 | —H | —NHCOCH$_3$ | —OH |
| 3 | —Me | —O$^n$Bu | —NH$_2$ |

(viii)

| I-(b)-(viii)- | R$^{26}$ | R$^{27}$ | R$^{28}$ |
|---|---|---|---|
| 1 | —H | —OH | —OH |
| 2 | —Me | —O$^n$Bu | —NH$_2$ |

(ix)

| I-(b)-(ix)- | R$^{29}$ |
|---|---|
| 1 | —H |
| 2 | —Me |

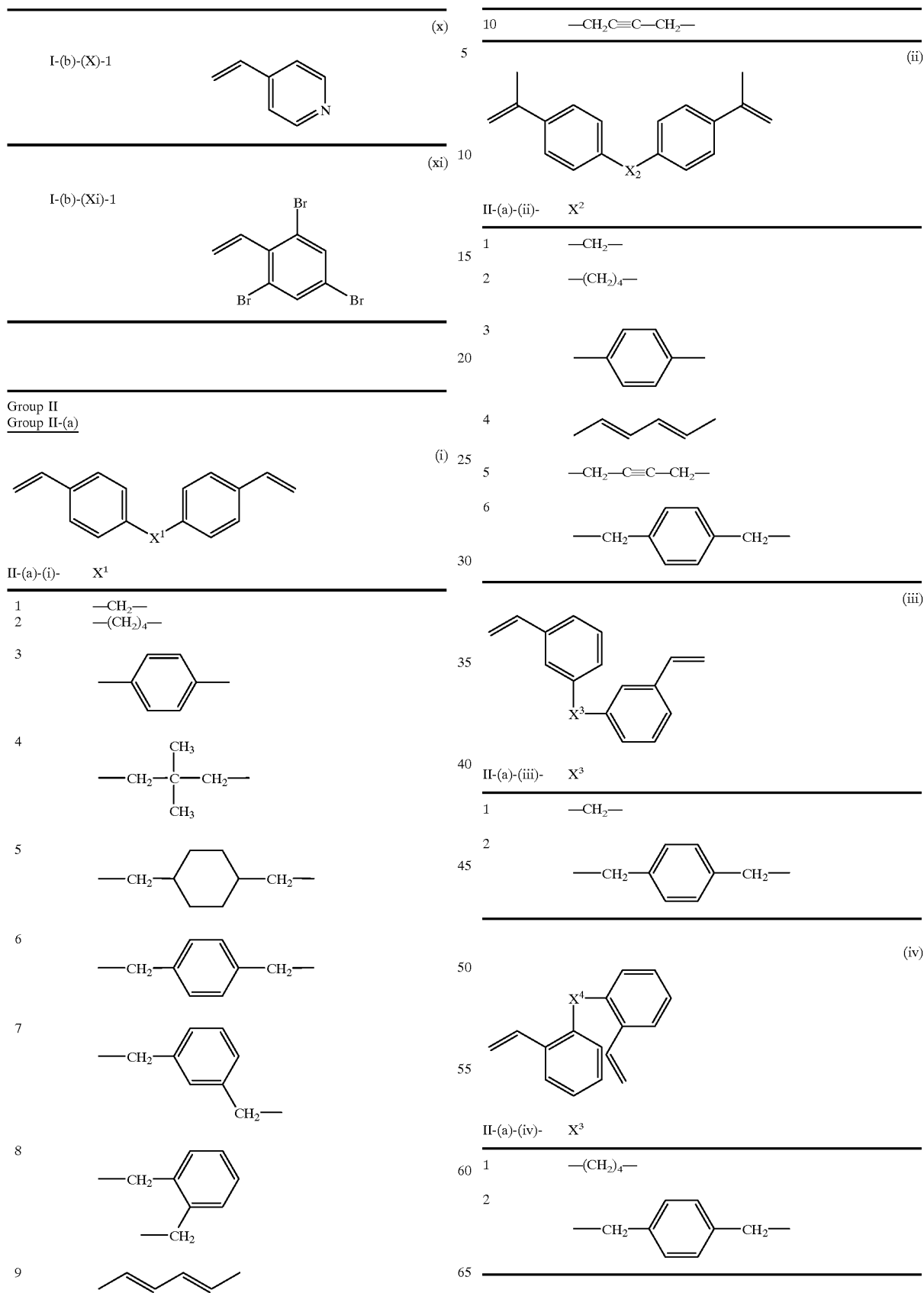

-continued

Group II-(b)

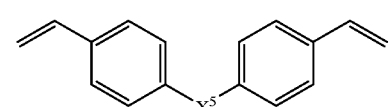 (i)

| II-(b)-(i)- | $X^5$ |
|---|---|
| 1 | $-CH_2OCO(CH_2)_7CO_2CH_2-$ |
| 2 | $-CH_2O(CH_2)_{12}O-$ |
| 3 | $-CH_2S(CH_2)_4S-$ |
| 4 | $-CH_2OCH_2CH(CH_2)_2OCH_2-$ with $CH_3$ branch |
| 5 | $-CH_2O(CF_2)_2OCH_2-$ |
| 6 | $-CH_2OSO_2(CH_2)_4SO_2OCH_2-$ |
| 7 | $-CH_2OC(=S)(CH_2)_4C(=S)OCH_2-$ |
| 8 | $-CH_2NH(CH_2)_2NHCH_2-$ |
| 9 | $-CH_2NH(CH_2)_2O-$ |
| 10 | $-CH_2N(CH_3)(CH_2)_2N(CH_3)-$ |
| 11 | $-CH_2SO_2(CH_2)_2SO_2CH_2-$ |
| 12 | $-CH_2O-\text{cyclohexyl}-OCH_2-$ |
| 13 | $-CH_2O-\text{phenyl}-OCH_2-$ (para) |
| 14 | $-CH_2O-C_6H_4-C(CH_3)_2-C_6H_4-OCH_2-$ |
| 15 | $-CH_2O-\text{phenyl}-OCH_2-$ (meta) |
| 16 | $-CH_2O-\text{phenyl}-OCH_2-$ (ortho) |
| 17 | $-CH_2O-C_6H_4-CH_2OCH_2-$ |
| 18 | $-CH_2S-C_6H_4-SCH_2-$ |
| 19 | $-CH_2NH-C_6H_4-NHCH_2-$ |
| 20 | $-CH_2O-C_6H_4-CO_2CH_2-$ |
| 21 | $-CH_2O-C_6H_4-NHCH_2-$ |
| 22 | $-CH_2S-C_6H_4-NHCH_2-$ |
| 23 | $-CH_2O-C_6H_4-O-C_6H_4-OCH_2-$ |
| 24 | $-CH_2OCO-C_6H_4-CO_2CH_2-$ |
| 25 | $-CH_2O-\text{naphthyl}-OCH_2-$ |
| 26 | $-CH_2O-C_6H_4-C_6H_4-OCH_2-$ |

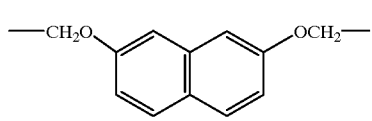 (ii)

| II-(b)-(ii)- | $X^6$ |
|---|---|
| 1 | $-CO(CH_2)_2CO-$ |
| 2 | $-CO(CH_2)_{12}CO-$ |
| 3 | $-COCHCH_2CO-$ with $CH_3$ branch |
| 4 | $-CONH(CH_2)_2NHCO-$ |
| 5 | $-CONH(CH_2)_2OCO-$ |
| 6 | $-CON(CH_3)(CH_2)_2N(CH_3)CO-$ |
| 7 | $-CO_2(CH_2)_{10}OCO-$ |
| 8 | $-CO-S-(CH_2)_2-S-CO-$ |
| 9 | $-CO-S-(CH_2)_3OCO-$ |
| 10 | $-SO_2-O(CH_2)_{12}O-SO_2-$ |
| 11 | $-SO_2-O(CH_2)_2OCO-$ |
| 12 | $-SO_2NH(CH_2)_6NHSO_2-$ |

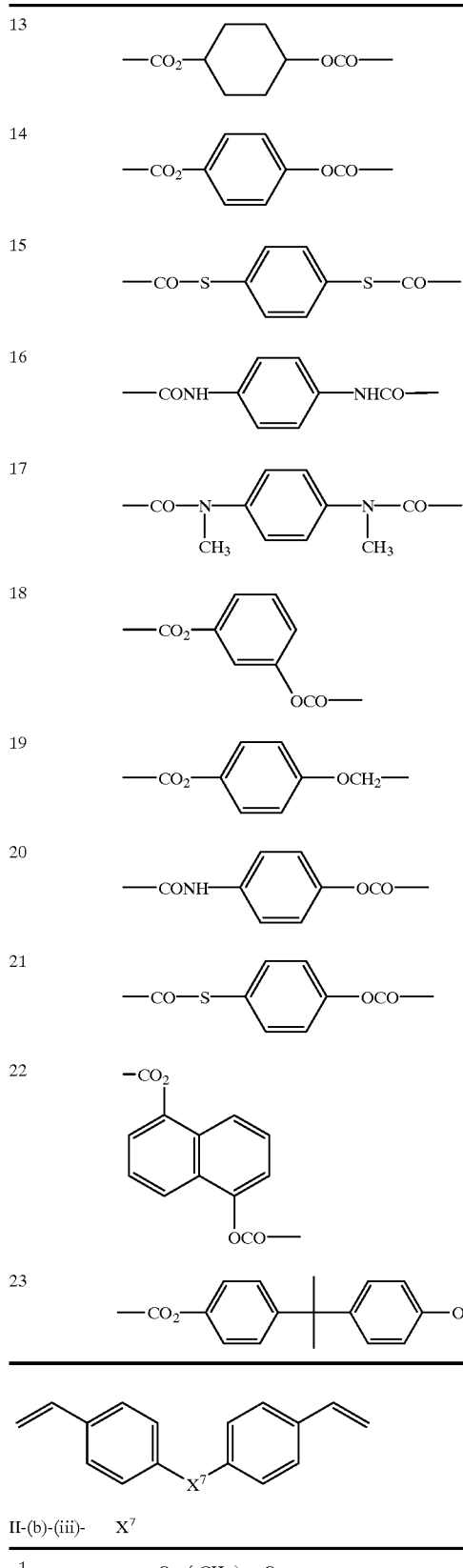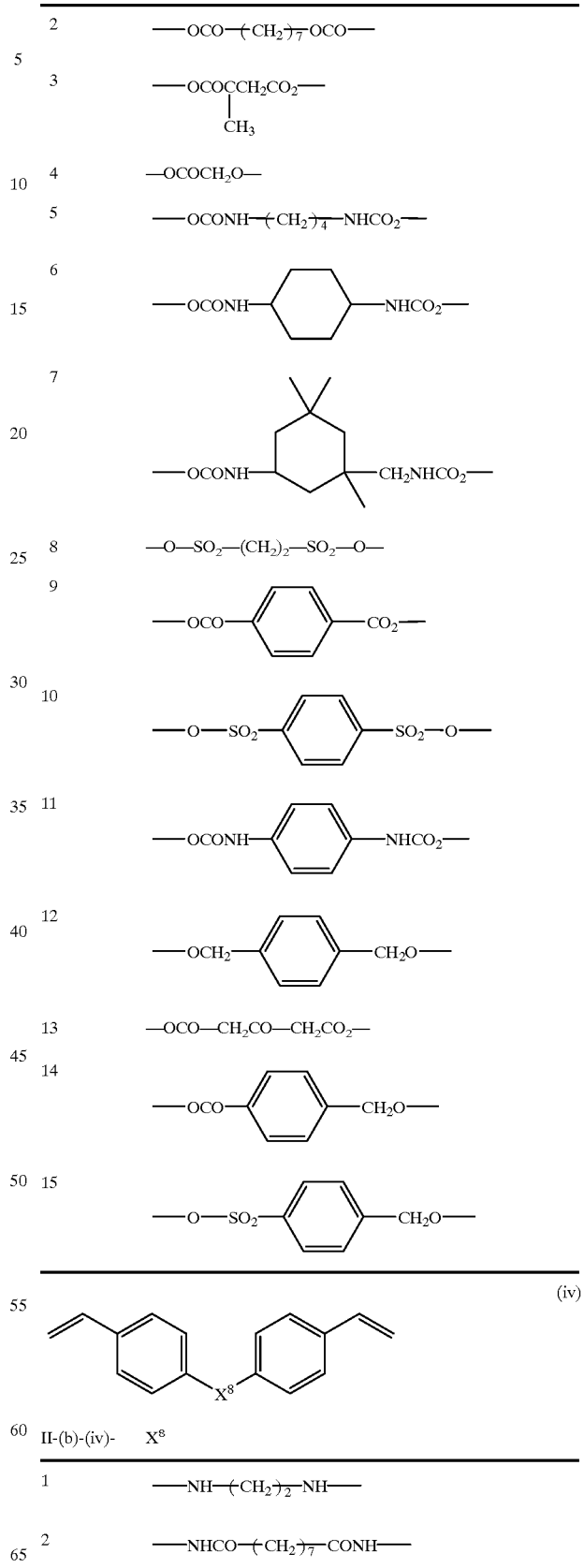

-continued

| | |
|---|---|
| 3 | 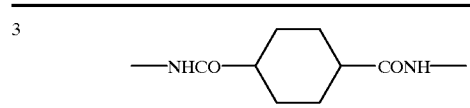 |
| 4 |  —NHCONH—(CH$_2$)$_6$—NHCONH— |
| 5 | 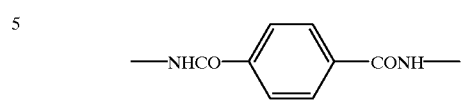 |
| 6 | 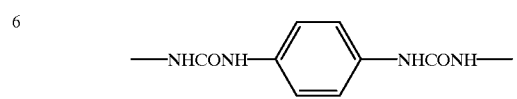 |
| 7 | —NHCONH— |

(v)

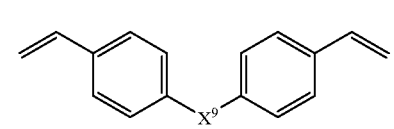

| II-(b)-(v)- | X$^9$ |
|---|---|
| 1 | —CH$_2$OCO—(CH$_2$)$_7$—CO$_2$CH$_2$— |
| 2 | —CH$_2$O—(CH$_2$)$_{12}$—OCH$_2$— |
| 3 | —OCO—(CH$_2$)$_8$—CO$_2$— |
| 4 | 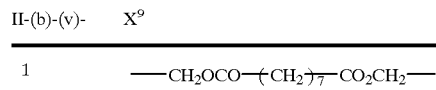 |
| 5 | 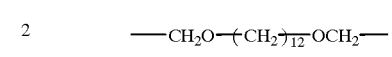 |
| 6 | —CO$_2$—(CH$_2$)$_7$—OCO— |
| 7 | —SO$_2$—O—((CH$_2$)$_{10}$O—SO$_2$— |
| 8 | 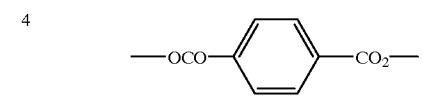 |
| 9 | —CONH—(CH$_2$)$_2$—NHCO— |
| 10 | —NHCO—(CH$_2$)$_6$—CONH— |
| 11 | 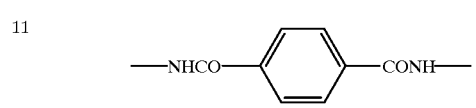 |

-continued (vi)

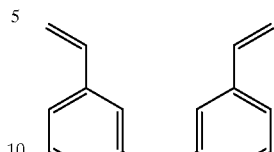

| II-(b)-(vi)- | X$^{10}$ |
|---|---|
| 1 | —O—(CH$_2$)$_6$—O— |
| 2 | 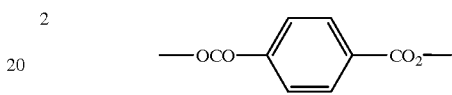 |
| 3 | —CH$_2$O—(CH$_2$)$_{12}$—OCH$_2$— |
| 4 | —CH$_2$OCO—(CH$_2$)$_7$—CO$_2$CH$_2$— |
| 5 | —OCONH—(CH$_2$)$_6$—NHCO$_2$— |
| 6 | 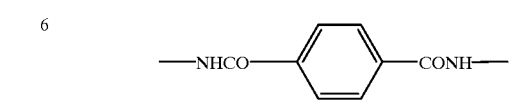 |
| 7 | —NHCONH—(CH$_2$)$_4$—NHCONH— |
| 8 | —CO$_2$(CH$_2$)$_4$OCO— |

(vii)

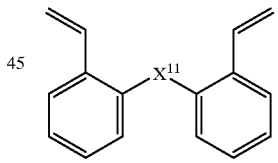

| II-(b)-(vii)- | X$^{11}$ |
|---|---|
| 1 | —O—(CH$_2$)$_6$—O— |
| 2 | —NH—(CH$_2$)$_4$—NH |
| 3 | 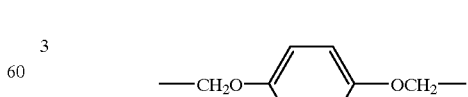 |
| 4 | —OCO—(CH$_2$)$_7$—CO$_2$— |

(viii)
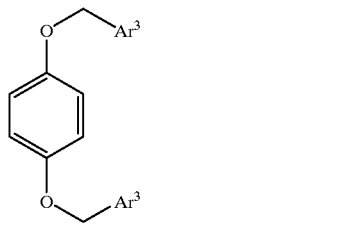
II-(b)-(viii)- Ar³
1 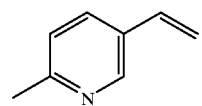
2 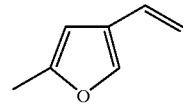
3 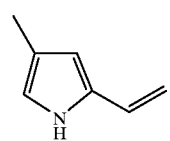
4 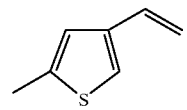
5 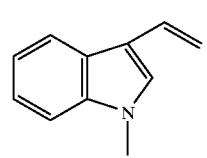
6 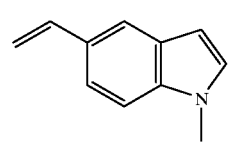
7 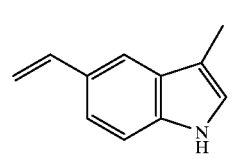
8 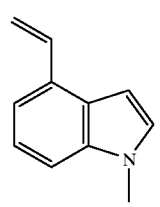
9 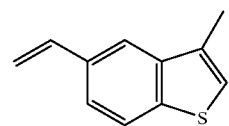
10 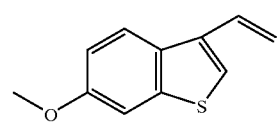
11 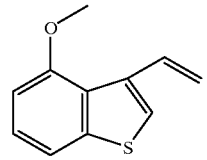
12 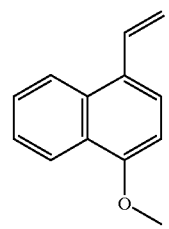
13 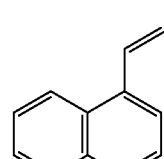
14 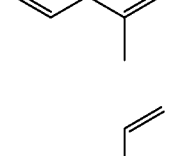
15 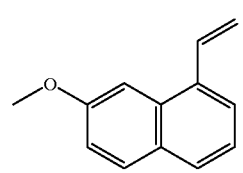
16 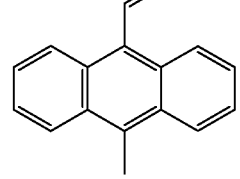

-continued
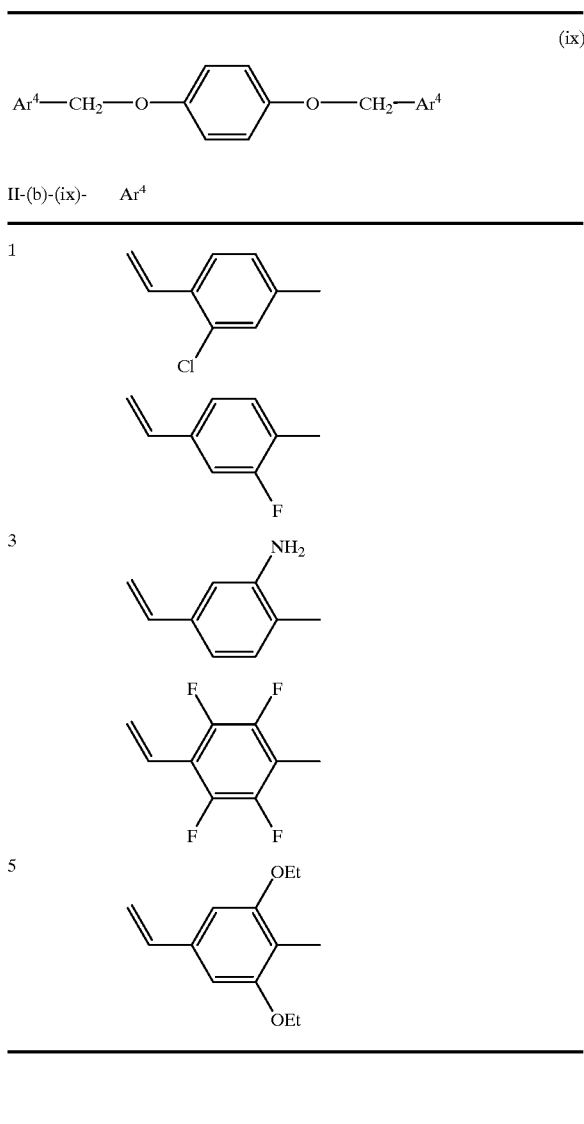
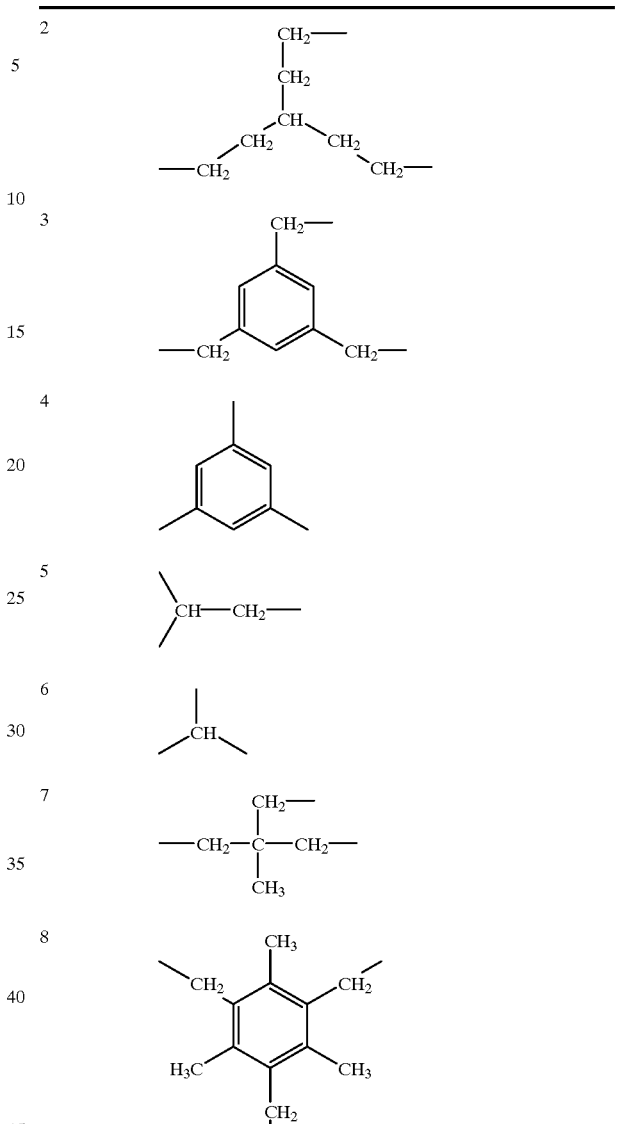
Group III
Group III-(a)
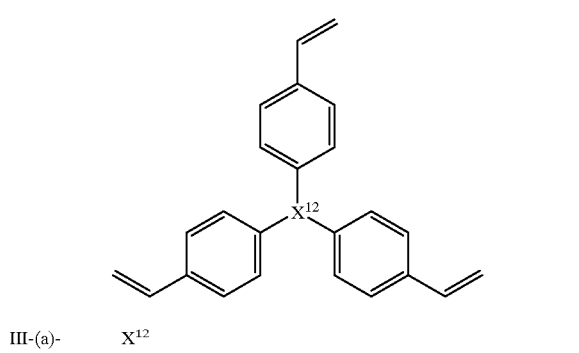
III-(a)- X$^{12}$
Group III-(b)
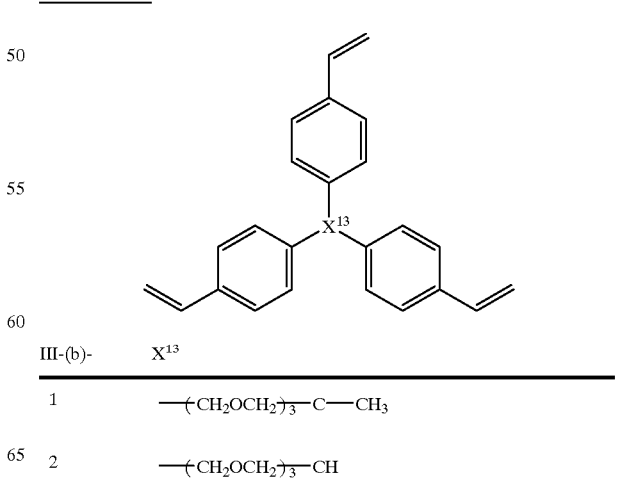

-continued
| | | | | |
|---|---|---|---|---|
| 3 | —(CH₂NHCH₂)₃—C—CH₃ | | 17 | 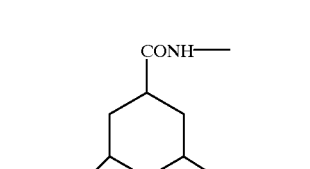 |
| 4 | —(CH₂NHCH₂)₃—CH | | 18 | 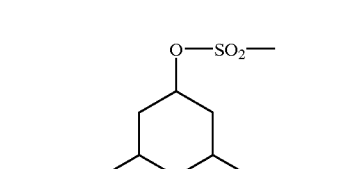 |
| 5 | —(CH₂SCH₂)₃—CH | | 19 | 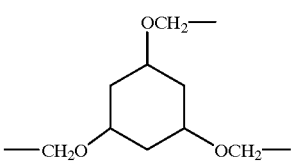 |
| 6 | 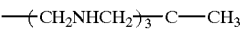 | | 20 | 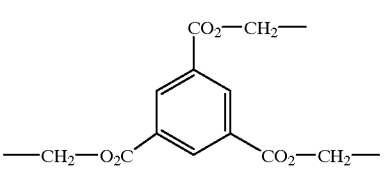 |
| 7 |  | | 21 | 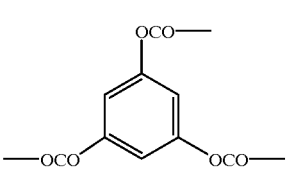 |
| 8 |  | | 22 | 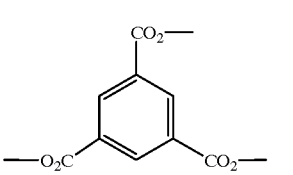 |
| 9 | —(OCH₂)₃—CH | | 23 | 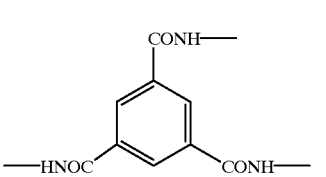 |
| 10 | —(NHCH₂)₃—CH | | 24 | 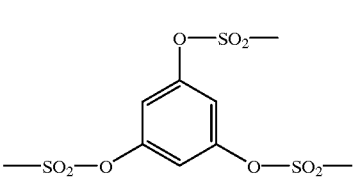 |
| 11 | —(CO₂CH₂)₃—CH | | | |
| 12 | —(SO₂OCH₂)₃—CH | | | |
| 13 | —(CONHCH₂)₃—CH | | | |
| 14 | 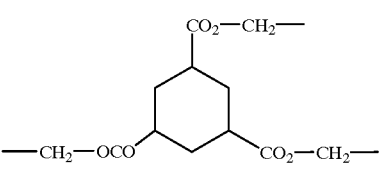 | | | |
| 15 | 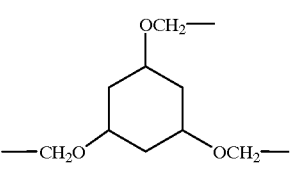 | | | |
| 16 | 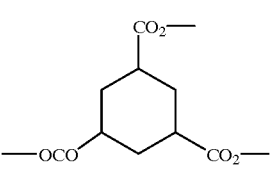 | | | |

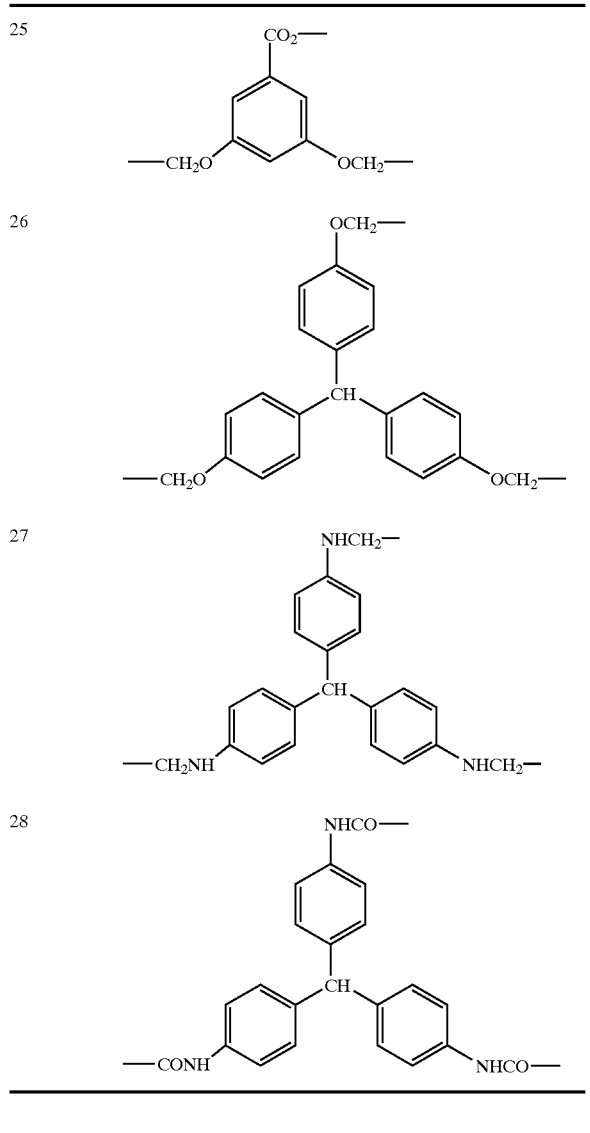
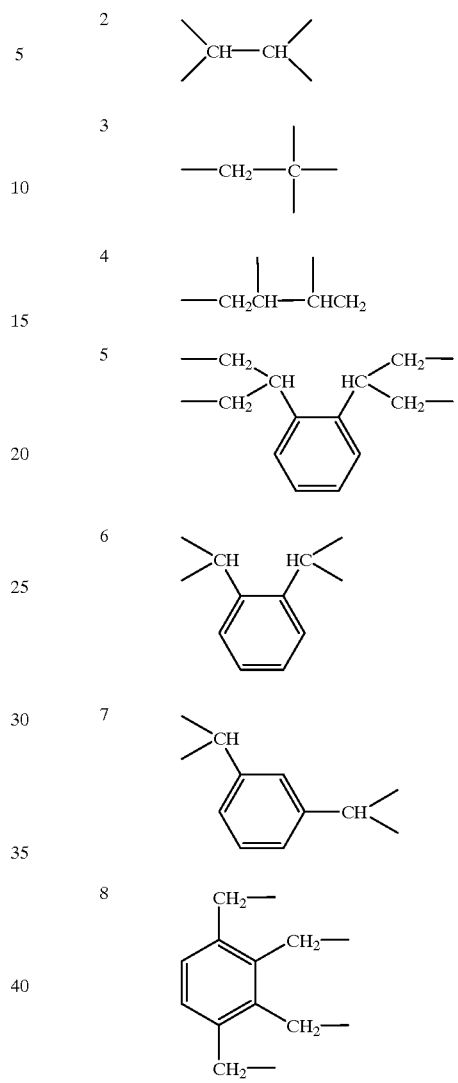
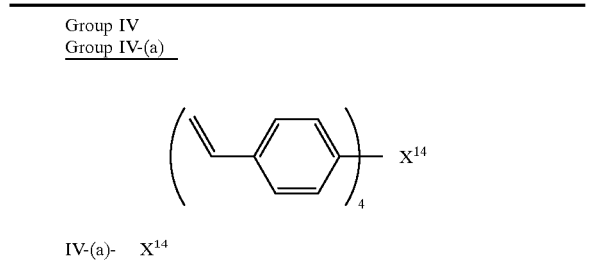
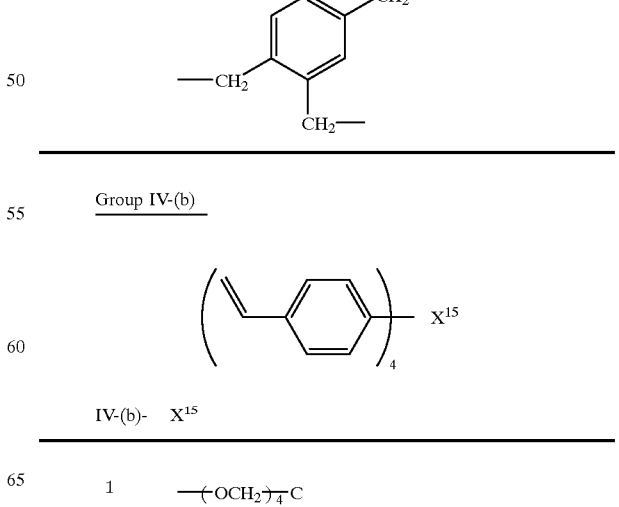

-continued
| | |
|---|---|
| 2 | —(CH₂OCH₂)₄—C |
| 3 | —(NHCH₂)₄—C |
| 4 | —(CH₂NHCH₂)₄—C |
| 5 | —(SCH₂)₄—C |
| 6 | —(CH₂SCH₂)₄—C |
| 7 | —(COCH₂)₄—C |
| 8 | —CH₂OCH(CH₂OCH₂—)(CHOCH₂—)CH₂OCH₂— |
| 9 | —(CO₂CH₂)₃—C—CH₂OCH₂— |
| 10 | —CH₂—O— pyranose —O—CH₂—, —CH₂, —CH₂ |
| 11 | cyclobutane with CO₂CH₂—, CO₂CH₂—, CO₂CH₂—, CH₂OCO— |
| 12 | cyclobutane with CO₂—, CO₂—, CO₂—, OCO— |
| 13 | benzene with CO₂CH₂—, OCH₂—, OCH₂—, OCH₂—, CH₂O— |
| 14 | benzene with CO₂—, OCH₂—, H₂C—, CH₂— |
| |
|---|
| Group VI |
| Group VI-(a) |
| VI-(a) |
1 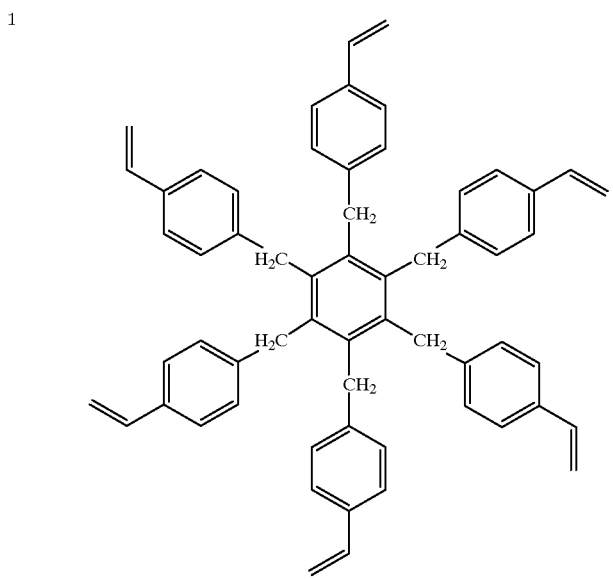

-continued

Group VI-(b)

VI-(b)

1
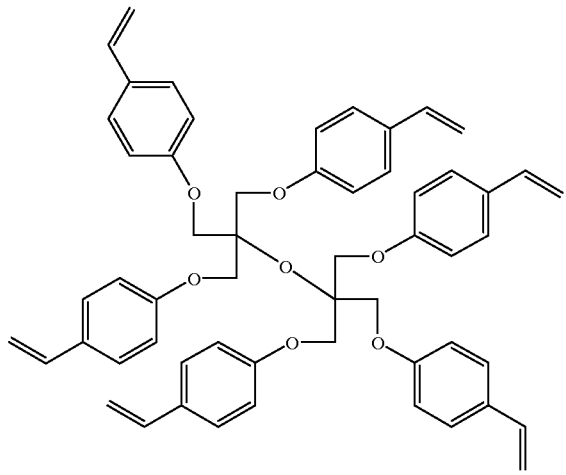

2
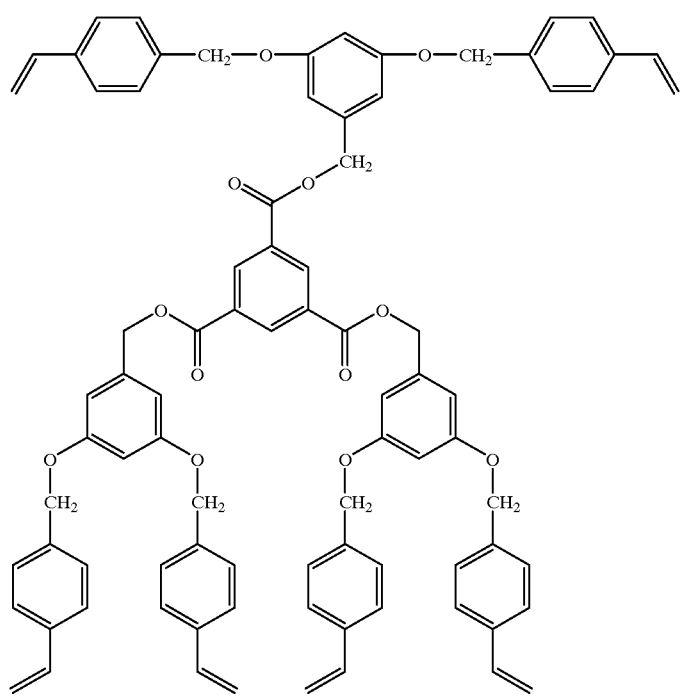

Of the chemical compounds indicated by way of example above, the compounds shown by way of example in group II~VI having two or more of the aforesaid styrene groups are preferable, and the compounds indicated by way of example in groups III~VI having three or more styrene groups are even more preferable. Also, of the compounds indicated by way of example in group I~IV, the compounds indicated by way of example of group (b) where the linkage group Z has a hetero atom are preferable in point of view of solubility and development characteristics.

In the negative type image recording material according to the present invention, compound (A) is preferably present in the amount of 5~70 weight % of total solids, and even more preferably 10~65 weight %. If the content of compound (A) is less than 5 weight %, or more than 70 weight %, the film strength of the image region when recorded may be lowered.

Compound (A) may be employed on its own, or two or more types thereof may be used together.

(B) Polymer Capable of Reaction with Compound (A) in the Presence of Acid (Hereinbelow Simply Referred to as "Polymer (B)")

In the negative type image recording material according to the present invention, polymer (B) functions as a so-called binder. A wide range of polymers can be employed so long as they have functional groups capable of reacting with styrene. Examples of polymers that may suitably be employed are: (1) polymers comprising structural units represented by general formula (3) below, (2) phenol resins such as novolak resin, or (3) polymers having in their structure a heterocyclic ring having an unsaturated bond in the ring. Of these, polymers (3) are preferable.

The respective polymers are described in detail below.

(1) Polymers Comprising Structural Units Represented by General Formula (3) Below

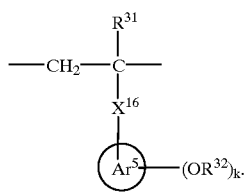

general formula (3)

In general formula (3), $Ar^5$ represents a benzene ring, naphthalene ring, or anthracene ring. $R^{31}$ indicates a hydrogen atom or a methyl group. $R^{32}$ indicates a hydrogen atom or an alkyl group having 20 or fewer carbon atoms. $X^{16}$ includes a single bond or one or more atoms selected from C, H, N, O and S, and divalent linkage groups of carbon number 0~20. k indicates an integer of 1~4.

Examples of structural units represented by general formula (3) that may suitably be used as polymer (B) are given below as (BP-1~BP-6), but the structural units of polymer (B) employed in the present invention are not restricted to these.

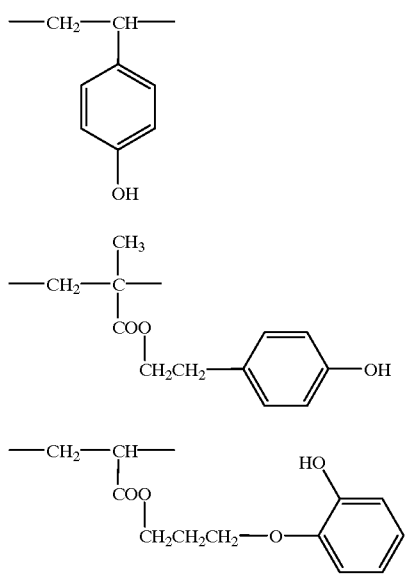

BP-1

BP-2

BP-3

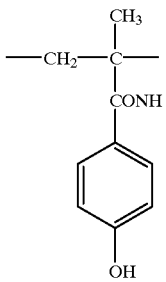

BP-4

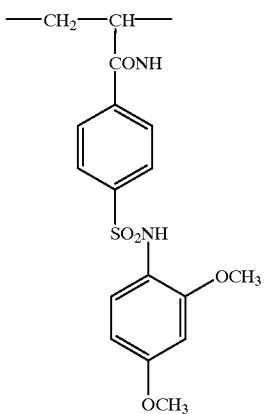

BP-5

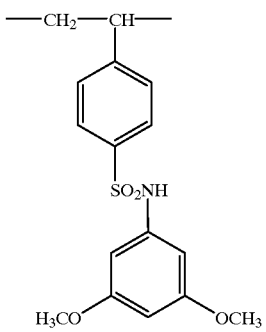

BP-6

The polymer of (1) above can be manufactured by the conventionally known radical polymerization method, using the corresponding monomer.

As the polymer (B), a homopolymer consisting solely of structural units represented by general formula (3) may be employed, or a copolymer may be employed having as structural units other known monomers (or derivatives thereof) together with these specified structural units. Examples of other known monomers that may be employed include acrylic acid esters such as methyl acrylate, ethyl acrylate, propyl acrylate, butyl acrylate, 2-ethylhexyl acrylate, cyclohexyl acrylate, 2-hydroxyethyl acrylate, and benzyl acrylate; methacrylic acid esters such as methyl methacrylate, ethyl methacrylate, propyl methacrylate, butyl methacrylate, 2-ethylhexyl methacrylate, cyclohexyl methacrylate, 2-hydroxyethyl methacrylate, and benzyl methacrylate; styrene, acrylonitrile and monomers containing an acid group such as acrylic acid or methacrylic acid; and monomers containing a strongly acidic salt such as sodium p-styrene sulfonate, alkali metal salts of 2-acrylamide-2-methylpropane sulfonic acid, tetraalkyl ammonia salts, or potassium 3-sulfopropyl acrylate.

The proportion of structural units represented by general formula (3) in polymer (1) is preferably 50~100 weight %, and even more preferably 60~100 weight %. Also the weight average molecular weight of polymer (1) is preferably at least 5000, and more preferably is 10,000~300,000. The number average molecular weight is preferably at least 1000, and even more preferably is 2000~250,000. The polydispersity (weight average molecular weight/number average molecular weight) is preferably at least 1, and even more preferably 1.1~10.

Polymer (1) may be any of a random polymer, block polymer, or graft polymer etc., but is preferably a random polymer.

Examples that may be given of the solvents that may be employed when synthesizing polymer (1) are: tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. These solvents may be used alone or as a mixture of two or more types. Also, as the radical polymerization initiator used for polymerizing polymer (1), known compounds such as an azo initiator, or peroxide initiator may be employed.

(2) Phenol Resins Such as Novolak Resins

Novolak resins are phenol resins that may be suitably employed. Of these, there may be mentioned as examples phenol novolak, the various o-, m- and p-cresol novolaks, their copolymers, and novolak resins etc. employing phenol substituted by halogen atoms or alkyl groups etc. The weight average molecular weight of these novolak resins is preferably at least 1000, and even more preferably 2000~20,000. The number average molecular weight is preferably at least 1000 and even more preferably 2000~15,000. The polydispersity is preferably at least 1 and even more preferably is 1.1~10.

(3) Polymer Having in its Structure a Heterocyclic Ring Having an Unsaturated Bond in the Ring A heterocyclic ring means a ring wherein, of the atoms constituting the ring system, at least one atom is a hetero atom other than a carbon atom. Of these, polymers having a heterocyclic ring whose constituent atoms include a nitrogen atom, an oxygen atom, or a silicon atom are preferable. Also, the heterocyclic ring preferably has at least one unsaturated bond; in particular an aromatic heterocyclic ring is preferable having at least two conjugated double bonds. For example, 5-member rings in which there are two conjugated double bonds, and six-member rings in which there are three conjugated double bonds, and heterocyclic rings obtained by a fusion of such heterocyclic rings are preferable. Particularly preferred heterocyclic rings are heterocyclic rings obtained by ring fusion of the above heterocyclic rings with a further aromatic hydrocarbon ring such as a benzene ring or naphthalene ring.

Specifically, there may be mentioned as examples polymers having single-ring type heterocyclic rings such as pyrrole, furan, thiophene, oxazole, isoxazole, thiazole, isothiazole, imidazole, pyrazole, furazan, oxadiazole, pyridine, pyridazine, pyrimidine, pyrazine, triazine, or silabenzene, fused heterocyclic rings such as indole, isoindole, benzofuran, benzothiophene, indolidine, quinoline, isoquinoline, purine, indazole, benzoindazole, benzothiazole, benzo-oxazole, quinazoline, cinnoline, quinoxaline, phthalazine, pteridine, carbazole, acridine, phenanthridine, xanthene, phenazine, or phenothiazine.

These heterocyclic rings may include substituents. Preferred substituents include hydrocarbon groups of carbon number 20 or less, alkoxy groups of carbon number 20 or less, aryloxy groups of carbon number 20 or less, and halogen atoms.

In polymer (3), the above heterocyclic rings may be introduced as a constituent constituting the main chain, but higher film strength is achieved if these heterocyclic rings are bonded in pendant fashion to the main chain or side chains; this is therefore desirable. Furthermore, although the heterocyclic rings may be directly bonded to the main chain, if they are bonded in pendant fashion through a suitable linkage chain, film strength is further raised; this is therefore desirable. Preferred examples of linkage chains that may be given include ester couplings, carboxylic acid amide couplings, sulfonic acid amide couplings, ether couplings, thioether couplings and organic groups of carbon number 20 or less, which may contain these couplings. Also, vinyl polymers, polyesters, and polyurethanes etc. may be given as examples where the polymer main chain is poly(meth) acrylate, polystyrene, or polyvinyl acetal, but, from the point of view of the availability and cost vinyl polymers are preferable.

As polymer (3), in particular, polymers are preferable that contain structural units represented by the following general formula (4).

general formula (4)

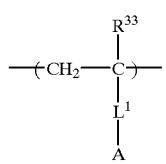

In general formula (4), $R^{33}$ represents a hydrogen atom or a methyl group. $L^1$ indicates a divalent organic group having 20 or fewer carbon atoms that may be a single bond, ester bond, carboxylic acid amide bond, sulfonic acid amide bond, ether bond, thioether bond, or may contain these bonds. Also, A indicates a heterocyclic ring.

Polymers having the structure represented by general formula (4) above may be manufactured by the conventionally known radical polymerization method, using the corresponding monomers represented by the following general formula (5). Symbols in general formula (5) below that are the same as in general formula (4) have the same meaning as the symbols of general formula (4).

general formula(5)

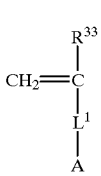

Of the polymers having the structural units represented by general formula (4), in particular polymers having structural units represented by the following general formulas (6)~(8) are preferred.

general formula (6)

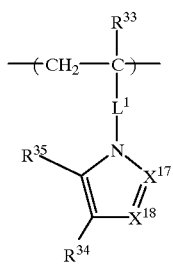

general formula (7)

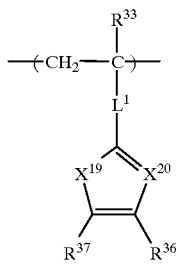

general formula (8)

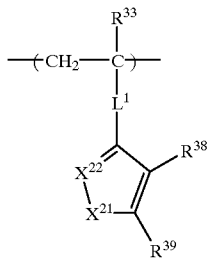

In general formulas (6)~(8), $R^{34}$, $R^{35}$, $R^{36}$, $R^{37}$, $R^{38}$ and $R^{39}$ represent a hydrogen atom or organic groups of carbon number 20 or less, which may contain substituent group; these organic groups may contain the hetero atoms: nitrogen atoms, oxygen atoms, or sulfur atoms. As the substituent groups, halogen atoms, alkoxy groups of carbon number 10 or less, or aryloxy groups of carbon number 10 or less are preferred. Also, fused structures may be employed, formed by rings obtained by respective coupling of $R^{34}$ and $R^{35}$, $R^{36}$ and $R^{37}$ and $R^{38}$ and $R^{39}$.

Symbols in general formulas (6)~(8) that are the same as those of general formula (4) have the same meaning as the symbols of general formula (4).

In general formula (6), $X^{17}$ and $X^{18}$ may be the same or different and represent a nitrogen atom or —$CR^{40}$. $R^{40}$ represents a hydrogen atom or a hydrocarbon group having 20 or fewer carbon atoms. In general formula (7), $X^{19}$ represents —$NR^{41}$, an oxygen atom, or a sulfur atom. $R^{41}$ represents hydrogen or a hydrocarbon group having 20 or fewer carbon atoms. $X^{20}$ represents a nitrogen atom or —$CR^{42}$. $R^{42}$ represents a hydrogen atom or a hydrocarbon group having 20 or fewer carbon atoms. In general formula (8), $X^{21}$ represents —$NR^{43}$, an oxygen atom, or a sulfur atom. $R^{43}$ represents a hydrogen atom or a hydrocarbon group having 20 or fewer carbon atoms. $X^{22}$ represents a nitrogen atom or —$CR^{44}$. $R^{44}$ represents a hydrogen atom or hydrocarbon group having 20 or fewer carbon atoms.

Polymers having the structural units represented by general formulas (6)~(8) can be manufactured by the conventionally known radical polymerization method, using the corresponding monomers expressed by the following general formulas (9)~(11).

Symbols in general formulas (9)~(11) that are the same as in general formulas (6)~(8) have the same meaning as the symbols in general formulas (6)~(8), and those that are the same as those of general formula (4) have the same meaning as in general formula (4).

general formula (9)

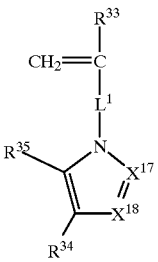

general formula (10)

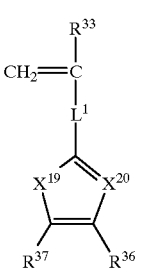

general formula (11)

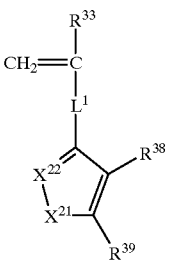

Hereinbelow example monomers represented by general formulas (9)~(11) are shown. However, the monomers of polymer (B) used in the present invention are not restricted to these.

In the formulas, $R^{33}$ represents a hydrogen atom or methyl group, and $Y^1$ represents an oxygen atom or NH. Also, n represents an integer of 1~20.

(9-1)

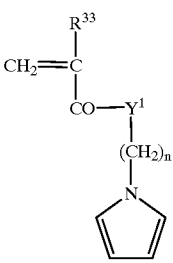

(9-2) 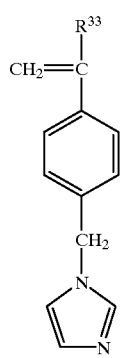
(9-3) 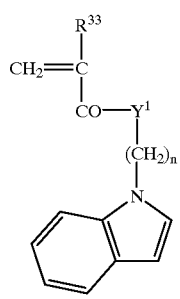
(9-4) 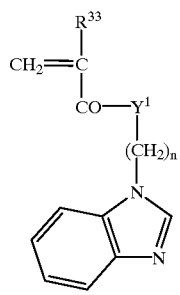
(9-5) 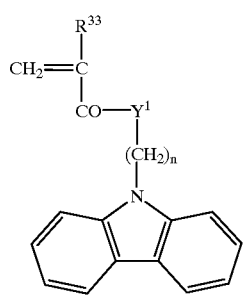
(10-1) 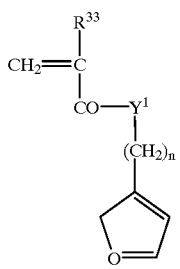
(10-2) 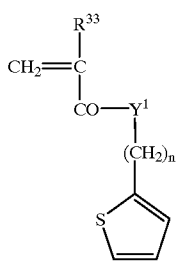
(10-3) 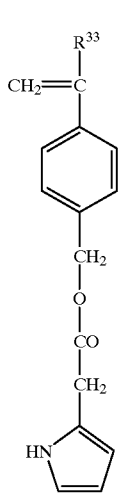
(10-4) 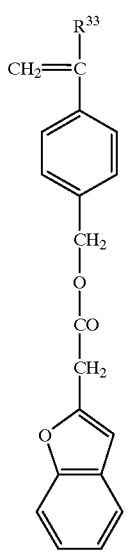

(10-5)
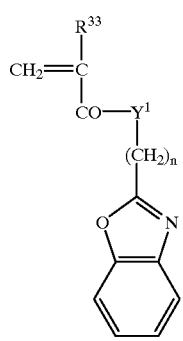
(10-6)
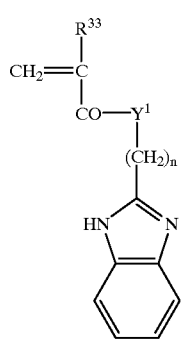
(10-7)
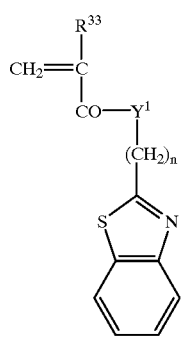
(10-8)
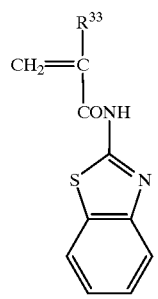
(10-9)
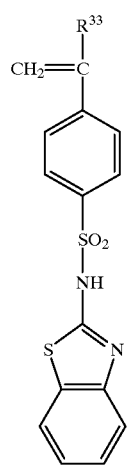
(10-10)
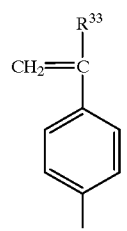
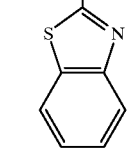

(10-11)

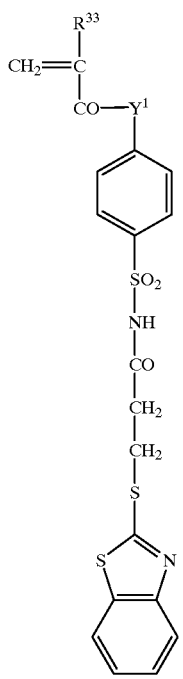

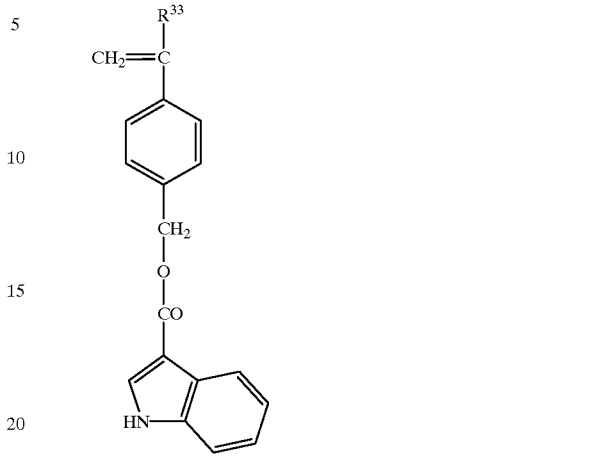

(11-1)

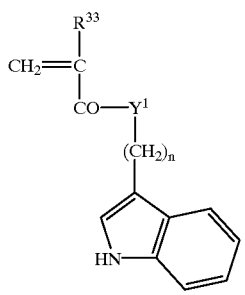

(11-2)

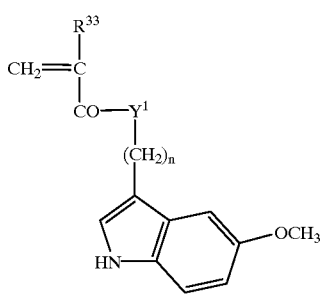

(11-3)

Of the monomers shown by way of example above, heterocyclic rings which are fused with a single benzene ring such as for example (9-3) are particularly preferred, since they have better film strength than monomers which do not comprise fused rings, and have better solubility for developer liquid than where two or more benzene rings are fused.

Preferably polymer (3) is a polymer obtained by radical polymerization of at least any of the monomers represented by general formulas (9)~(11) above. These polymers may be homopolymers in which only one type of monomer represented by general formulas (9)~(11) is employed, or may be copolymers employing two or more of these. As polymer (3), copolymers obtained by radical polymerization of at least any of the monomers represented by general formulas (9)~(11) and monomers having an acidic group such as a carboxylic acid are even more preferable. Introduction of an acidic group into the polymer is desirable, since it improves developing characteristics with water or alkaline aqueous solution. As an acidic group, there may be mentioned for example —COOH, —CONHCO—, —CONHSO$_2$—, —SO$_2$NH—, or phenolic OH etc. However, cases where the aforesaid acidic group is already present in the monomer structure represented by general formulas (9)~(11) are likewise desirable, even if they do not represent copolymers with monomers having other acidic groups (even if they are for example homopolymers).

As the aforesaid monomers having acidic groups there may be mentioned for example: acrylic acid, methacrylic acid, itaconic acid, maleic acid, N-(2-carboxyethyl) acrylamide, N-(2-carboxyethyl)methacrylamide, N-(carboxyphenyl)acrylamide, N-(carboxyphenyl) methacrylamide, carboxystyrene, maleimide, N-(phenylsulfonyl)acrylamide, N-(phenylsulfonyl) methacrylamide, N-(tolylsulfonyl)acrylamide, N-(tolylsulfonyl)methacrylamide, N-(chlorophenylsulfonyl) acrylamide, N-(chlorophenylsulfonyl)methacrylamide, N-(sulfamoylphenyl)acrylamide, N-(sulfamoylphenyl) methacrylamide, N-(methylsulfamoylphenyl)acrylamide, N-(methylsulfamoylphenyl)methacrylamide, N-(phenylsulfamoylphenyl)acrylamide, N-(phenylsulfamoylphenyl)methacrylamide, N-(tolylsulfamoylphenyl) acrylamide, N-(tolylsulfamoylphenyl)methacrylamide, N-[(chlorophenylsulfamoyl)phenyl]acrylamide, N-[(chlorophenylsulfamoyl)phenyl]methacrylamide, N-(hydroxyphenyl)acrylamide, N-(hydroxyphenyl) methacrylamide, N-(hydroxynaphthyl) acrylamide, or N-(hydroxynaphthyl)methacrylamide.

Also, although they are not acidic groups, if a copolymer with monomer containing a strongly acidic salt such as sodium p-styrene sulfonate, an alkali metal or tetraalkyl ammonium salt of 2-acrylamide-2-methylpropane sulfonic acid, or potassium 3-sulfopropyl acrylate is employed also, water solubility can be improved, and, as a result, developing performance of the image recording material with an aqueous developer liquid can be improved. These are therefore desirable constituents of the copolymer.

Further, copolymerization may be performed using if necessary conventionally known monomers other than the monomers containing acidic groups referred to above or monomers containing salts referred to above. As examples of these other known monomers, there may be mentioned: acrylic acid esters such as methyl acrylate, ethyl acrylate, propyl acrylate, butyl acrylate, 2-ethyhexyl acrylate, cyclohexyl acrylate, 2-hydroxyethyl acrylate, or benzyl acrylate; methacrylic acid esters such as methyl methacrylate, ethyl methacrylate, propyl methacrylate, butyl methacrylate, 2-ethyhexyl methacrylate, cyclohexyl methacrylate, 2-hydroxyethyl methacrylate, or benzyl methacrylate; and acrylonitrile etc.

As polymer (3), it is desirable that the structural units represented by general formulas (6)~(8) should be present in the ratio of 20~100 weight %, and even more desirably 30~95 weight %. Also, the weight average molecular weight of polymer (3) is desirably at least 5000, and more desirably 10,000~300,000. The number average molecular weight is desirably at least 1000, and more desirably 2000~250,000. The polydispersity (weight average molecular weight/ number average molecular weight) is desirably in the range 1.1~10.

Polymer (3) may be any of a random polymer, block polymer, or graft polymer etc., but is desirably a random polymer.

Examples of solvents that may be used in synthesizing polymer (3) include: tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. These solvents may be used alone or in the form of a mixture of two or more.

For polymer (B), one type of polymer may be used alone, or two or more types may be used together. The content of polymer (B) in the total solids in the negative type image recording medium of the present invention is preferably 20~95 weight %, and more preferably 40~90 weight %. If the content is less than 20 weight %, the film strength tends to drop when an image is formed. On the other hand, if it is more than 95 weight %, sensitivity tends to drop.

(C) Compound that Generates Acid in Response to Energetic Radiation, an Electron Beam, or Heat (Hereinbelow Referred to as "Acid Generating Agent")

A wide range of acid generating agents can be used in the present invention so long as they are compounds capable of decomposing to generate acid on irradiation with light or an electron beam or being supplied with heat of above 100° C. Preferably the acid generated is a strong acid of pKa 2 or less, such as sulfonic acid or hydrochloric acid, or a Lewis acid etc. As acid generating agents that may suitably be employed in the present invention, there may be mentioned as examples onium salts such as iodonium salts, sulfonium salts, phosphonium salts, or diazonium salts. Specifically, the acid generating agents mentioned in U.S. Pat. No. 4,708,925 or JP-A No. 7-20629 may be mentioned as examples. In particular, iodonium salts, sulfonium salts, or diazonium salts in which the counter ion is a sulfonic acid ion are preferable. As the diazonium salt, the diazonium compound described in U.S. Pat. No. 3,867,147, the diazonium compound described in U.S. Pat. No. 2,632,703, or the diazo resins described in JP-A No. 1-102456 and JP-A No. 1-102457 are preferable. Also, the benzylsulfonates described in U.S. Pat. No. 5,135,838 or U.S. Pat. No. 5,200,544 are preferable. Furthermore, the active sulfonic acid esters or disulfonyl compounds described in JP-A No. 2-100054, JP-A No. 2-100055, and Japanese Patent Application No. 8-9444 are preferable. Apart from these, the haloalkyl-substituted S-triazines described in JP-A No. 7-271029 are preferable.

When the negative type image recording material of the present invention is a negative type image recording material capable of heat mode image recording of the type corresponding to an infra-red laser, preferably the acid generating agent is a diazonium salts, iodonium salt, or sulfonic acid ester etc. And in the case where it is a negative type recording material of the type corresponding to a short wavelength (normally, 300~450 nm) laser or visible (460 nm~760 nm) laser, the acid generating agent is preferably a diazonium salt, iodonium salt, sulfonic acid ester, or triazine etc. Further, in the case where it is a negative type recording material of the type capable of responding to an electron beam, the acid generating agent is preferably a sulfonium salt etc.

In a negative type image recording material according to the present invention, the content of acid generating agent (C) in the total solids is preferably 0.01~50 weight %, more preferably 0.1~25 weight %, and even more preferably 0.5~15 weight %. If the content is less than 0.01 weight %, sensitivity tends to be lowered. On the other hand, if it is more than 50 weight %, when employed in printing plate, contamination of the non-image region may occur.

A negative type image recording material according to the present invention may contain other constituents, depending on the application.

(D) Sensitizers

The aforesaid acid generating agent generates acid by decomposition on irradiation with light or an electron beam, or on being supplied with heat. However, if the wavelength etc. of the light absorbed by the acid generating agent and the wavelength etc. of the light source used for image recording do not coincide, sensitivity can be increased by introducing a sensitizer. For example, by making a negative type image recording material according to the present invention contain a sensitizer that absorbs visible light rays, a negative type image recording material according to the present invention can be given high sensitivity as an image recording medium of the type that responds to visible light trace even though the acid generating agent which it contains is a compound that does not absorb visible light. As the sensitizer that absorbs visible light in this way, known sensitizers that are conventionally employed in image recording materials of the optical radical polymerization type may be employed. Specifically, there may be mentioned by way of example the eosins described in JP-A No. 4-219756, or the coloring matter having a thiazolidinone skeleton disclosed in JP-A No. 2-244050 and Japanese Patent Application No. H. 7-23133. Decomposition of these acid generating agents is promoted by a mechanism of increased sensitivity to electron movement or increased sensitivity to energy movement.

When the negative type image recording material of the present invention is of the type responsive to a short wavelength laser, it preferably contains a sensitizer having a sensitizer absorption maximum wavelength of 300 nm~450 nm, and more preferably of absorption maximum wavelength 350 nm~450 nm. While there is no particular restriction on such sensitizers, there may be mentioned by way of example merocyanine coloring matter, cyanine coloring matter, p-aminobenzoyl compounds (Michler's ketone etc.), thioxanthones (diethyl thioxanthone etc.), and acrylidines (p-phenyl acrylidine etc.). However, since acid generating agents usually generate acid by absorbing UV light, in the case where the negative type image recording material of the present invention is of the type which is responsive to a short wavelength laser, a high sensitivity recording material is provided even if no sensitizer is present.

In the case where the negative type image recording material of the present invention is of the type responsive to a visible laser, it is preferable that it should contain a sensitizer that absorbs visible light of 460 nm~760 nm. Although there is no particular restriction regarding such sensitizers, examples that may be given include merocyanine coloring matter, cyanine coloring matter, p-aminobenzoyl compounds (Michler's ketone etc.), thioxanthones (such as diethyl thioxanthone, or acrylidines (such as p-phenyl acrylidine).

Also, when the negative type image recording material of the present invention is intended for heat mode image recording of the IR laser responsive type, preferably a dye or pigment (hereinbelow called "IR absorbent") that absorbs IR of wavelength 760 nm to 1200 nm (preferably having an absorption maximum in this wavelength region) is included as sensitizer. As this dye, commercially available dyes and for example known dyes disclosed in references such as "Dye Handbook" (Senryo Benran) (compiled by the Organic Synthetic Chemistry Association of Japan (Yuki Gosei Kagaku Kyokai), published 1970) may be employed. Specific examples that may be given include azo dyes, metallic complex salt azo dyes, pyrazolone azo dyes, naphthoquinone dyes, anthraquinone dyes, phthalocyanine dyes, carbonium dyes, quinone imine dyes, methine dyes, cyanine dyes, squarylium coloring matter, pyrylium salts, and dyes such as metallic thiolate complexes.

Preferred examples of dyes as IR absorbents include: the cyanine dyes disclosed in JP-A No. 58-125246, JP-A No. 59-84356, JP-A No. 59-202829, and JP-A No. 60-78787; the methine dyes disclosed in JP-A No. 58-173696, JP-A No. 58-181690, and JP-A No. 58-194595; the naphthoquinone dyes disclosed in JP-A No. 58-112793, JP-A No. 58-224793, JP-A No. 59-48187, JP-A No. 59-73996, JP-A No. 60-52940, and JP-A No. 60-63744; the squarylium coloring matter disclosed in JP-A No. 58-112792; and the cyanine dyes disclosed in British patent number 434875.

Also, the near IR absorption sensitizer disclosed in U.S. Pat. No. 5,156,938 may suitably be employed. Also, the substituted arylbenzo(thio)pyrylium salt disclosed in U.S. Pat. No. 3,881,924, the trimethine thiopyrylium salt disclosed in JP-A No. 57-142645 (U.S. Pat. No. 4,327,169), the pyrylium-based compounds disclosed in JP-A No. 58-181051, JP-A No. 58-220143, JP-A No. 59-41363, JP-A No. 59-84248, JP-A No. 59-84249, JP-A No. 59-146063, and JP-A No. 59-146061, the cyanine coloring matter disclosed in JP-A No. 59-216146, the pentamethine thiopyrylium salt etc. disclosed in U.S. Pat. No. 4,283,475, or the pyrylium compound disclosed in Japanese Patent Application Publication (JP-B) No. 5-13514 and JP-B No. 5-19702 may desirably be employed.

Other preferred examples of dyes are the near IR absorbent dyes disclosed in formulas (I) and (II) in U.S. Pat. No. 4,756,993.

Of these, there may be mentioned as particularly desirable IR absorbers cyanine coloring matter, squarylium coloring matter, pyrylium salt, and nickel thiolate complexes.

Also, as pigments used as IR absorbents, there may be mentioned the pigments etc. disclosed in the commercially available pigment and color index (C. I.) Handbook, "Saishin Ganryo Benran (Handbook of Modern Pigments)" (compiled by the Pigment Technology Association of Japan (Nippon Ganryo Gijutsu Kyokai), 1977 edition), "Saishin Ganryo Oyo Gijutsu (Modern Pigments-Application Techniques)" (published by CMC, 1986 edition) and "Insatsu Inki Gijutsu (Printing Ink Technology)" published by CMC, 1984 edition).

As types of pigment there may be mentioned: black pigments, yellow pigments, orange pigments, brown pigments, red pigments, purple pigments, blue pigments, green pigments, fluorescent pigments, metallic powder pigments, etc., and polymer-coupled coloring matter. Specifically, there may be employed: insoluble azo pigments, azo lake pigments, condensed azo pigments, chelate azo pigments, phthalocyanine based pigments, anthraquinone based pigments, perylene and perynone based pigments, thio-indigo pigments, quinacridone based pigments, dioxazine based pigments, isoindolinone-based pigments, quinophthalone based pigments, and dyed lake pigments, azine pigments, nitroso pigments, nitro pigments, natural pigments, fluorescent pigments, inorganic pigments and carbon black etc. Of these pigments, carbon black is preferable.

These pigments may be used after being subjected to surface treatment. Methods of surface treatment that may be considered include the method of surface coating with resin or wax, the method of applying a surfactant, and the method of bonding a reactive substance (for example, a silane coupling agent, epoxy compound, or polyisocyanate etc.) to the pigment surface. These methods of surface treatment are disclosed in "Properties and Applications of Metallic Soaps (Kinzoku Sekken no Seishitsu to Oyo)" (Koshobo), "Insatsu Inki Gijutsu (Printing Ink Technology)" (published by CMC, 1984 edition) and "Saishin Ganryo Oyo Gijutsu (Modern Pigments-Application Techniques)" (published by CMC, 1986 edition).

When a pigment is employed as an IR absorbent, its grain size is preferably 0.01 $\mu$m~10 $\mu$m, more preferably 0.05 $\mu$m~1 $\mu$m, and particularly preferably 0.1 $\mu$m~1 $\mu$m. If the grain size of the pigment is less than 0.01 $\mu$m, for example when preparing an application liquid containing the negative type image recording material of the present invention, dispersion tends to be lowered; on the other hand, if it is more than 10 $\mu$m, for example when forming an image recording layer containing the negative type image recording material of the present invention, uniformity of this layer tends to be lowered.

When the pigment is employed as an IR absorbent, the pigment is preferably used in dispersed form. As methods of dispersing the pigment, the known dispersion techniques employed in the manufacture of inks and the manufacture of toner may be employed. Examples of dispersion devices that may be used include ultrasonic wave dispersion devices, sand mills, attritors, pearl mills, super mills, ball mills, impellers, KD mills, colloid mills, dynatrons, 3-high rolling mills, and pressurized kneaders. Details are given in "Saishin Ganryo Oyo Gijutsu (Modern Pigments-Application Techniques)" (published by CMC, 1986 edition).

When the aforesaid dyes or pigments are included in a negative type image recording material according to the present invention, they are preferably present in the amount of 0.01~50 weight % of the total solids of the negative type image recording material, and more preferably are present in the amount of 0.1~10 weight %. In the case of dyes, it is particularly preferred to employ 0.5~10 weight % and in the case of pigments it is particularly preferred to employ 1.0~10 weight %. If the content of pigment or dye is less than 0.01 weight %, sensitivity is lowered; on the other hand, if it exceeds 50 weight %, when used as a printing plate, contamination of the non-image region may occur during printing.

The sensitizer may be included in the same layer as the constituents (A)~(C), or a separate layer may be provided, and the sensitizer included in this layer.

In general in the case of sensitizers for visible light, the mechanism of their action is considered to depend on energy movement or electron movement, as stated in "Zokanzai" (Sensitizers) (compiled by Kakumi Tokumaru and Shin Okawara, Kodansha Inc.). However, in the case of IR sensitizers, the mechanism of their action has not yet been fully established. For example, it is considered that the IR absorbent may cause thermal decomposition of the acid generating agent by emitting heat after absorbing IR radiation.

(E) Other Constituents

If necessary, various further compounds may be added to the negative type image recording material of the present invention.

For example, a dye that has large absorption in the visible light band may be added with the object of making the difference between the image region and non-image region clearer after image formation. As specific examples there may be listed Oil Yellow #101, Oil Yellow #103, Oil Pink #312, Oil Green BG, Oil Blue BOS, Oil Blue #603, Oil Black BY, Oil Black BS, Oil Black T-505 (the above manufactured by Orient Chemical Industries (Orient Kagaku Kogyo) Ltd.), Victoria Pure Blue, Crystal Violet (CI 42555), Methyl Violet (CI 42535), Ethyl Violet, Rhodamine B (CI-145170B), Malachite Green (CI 42000), Methylene Blue (CI 52015) etc. and the dyes set out in JP-A No. 62-293247.

Preferably the content of the dye in a negative type image recording material according to the present invention is 0.01~10 weight % of total solids.

Also, a negative type image recording material according to the present invention may contain organic basic compounds as other constituents. As the organic basic compounds employed, compounds of stronger basicity than phenol are preferable; of these, nitrogen-containing basic compounds are preferred. In particular, basic compounds are preferred having the partial structures expressed by the following general formula (12)~general formula (16), in which the nitrogens have respectively different chemical environments.

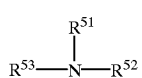

(12)

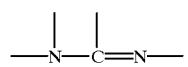

(13)

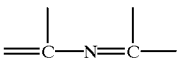

(14)

(15)

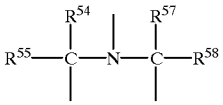

(16)

In general formula (12), $R^{51}$, $R^{52}$, and $R^{53}$ can be the same or different, and represent hydrogen, alkyl groups of carbon number 1~6, hydroxyalkyl groups of carbon number 1~6, or substituted or unsubstituted aryl groups of carbon number 6~20. Also $R^{52}$ and $R^{53}$ may form mutually coupled rings. In general formula (16), $R^{54}$, $R^{55}$, $R^{56}$ and $R^{57}$ represent alkyl groups having 1~6 carbon atoms, and may be the same or different.

Of these, organic basic compounds having two or more nitrogens in different chemical environments in the same molecule are preferred. In particular, there are preferred basic compounds having in the same molecule both a substituted or unsubstituted amino group and a heterocyclic ring containing a nitrogen atom, or compounds having an alkylamino group. As specific examples, there may be mentioned substituted or unsubstituted guanidine, substituted or unsubstituted aminopyridine, substituted or unsubstituted aminoalkylpyridine, substituted or unsubstituted aminopyridine, substituted or unsubstituted indazole or imidazole, substituted or unsubstituted pyrimidine, substituted or unsubstituted pyrazine, substituted or unsubstituted purine, substituted or unsubstituted imidazoline, substituted or unsubstituted pyrazolone, substituted or unsubstituted piperazine, substituted or unsubstituted aminomorpholine, or substituted or unsubstituted aminoalkylmorpholine. Preferred substituents that may be mentioned as examples include amino groups, aminoalkyl groups, alkylamino groups, aminoaryl groups, aminoaryl groups, arylamino groups, alkyl groups, alkoxy groups, acyl groups, acyloxy groups, aryl groups, aryloxy groups, nitro groups, hydroxyl groups, or cyano groups etc.

Particularly preferred compounds are: guanidine, 1,1-dimethyl guanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylamino-pyridine, 4-dimethyl aminopyridine, 2-dimethyl-aminopyridine, 2-(aminomethyl) pyridine, 2-amino-3-methylpyridine, 2-amino-4-methyl pyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)piperidine, pyrazole, 3-amino-5-methylpyrazole, 5-amino-3-methyl-1-p-tripyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine etc.; however, there is no restriction to these.

The organic basic compounds may be used alone or may be used in a combination of two or more. The content ratio of organic basic compounds is preferably that the (mol amount of acid generating agent)/(mol amount of organic basic compound) is 2.5~300, more preferably 5.0~200, and even more preferably 7.0~150. If the aforesaid mol ratio is less than 2.5, sensitivity tends to drop. On the other hand, if it exceeds 300, there may be a lowering of storage stability, resulting in lower resolution of fine patterns.

The negative type image in recording material of the present invention, with the object of improving stability to treatment in regard to development conditions, may include a non-ionic surfactant as disclosed in JP-A No. 62-251740 or JP-A No. 3-208514, or an amphoteric surfactant as disclosed in JP-A No. 59-121044 or JP-A No. 4-13149. As specific examples of non-ionic surfactants, there may be mentioned sorbitan tristearate, sorbitan monopalmitate, sorbitan trioleate, stearic acid monoglycerde, and polyoxyethylene nonylphenyl ether. As specific examples of amphoteric surfactants, there may be mentioned alkyl di(aminoethyl) glycine, alkyl polyaminoethylglycine hydrochloride, 2-alkyl-N-carboxyethyl-N-hydroxyethyl imidazolinium betaine, and N-tetradodecyl-N,N-betaine types (for example, Mogen K (trade name) manufactured by Daiichi Kogyo Inc.) etc.

The content of non-ionic surfactant and amphoteric surfactant in the negative type image recording material of the present invention is preferably 0.05~15 weight %, and more preferably 0.15 weight %.

The negative type image recording material of the present invention may contain if necessary plasticisers in order to confer flexibility of the film. As plasticisers there may be employed for example polyethylene glycol, tributyl citrate, diethyl phthalate, dibutyl phthalate, dihexyl phthalate, dioctyl phthalate, tricresyl phosphate, tributyl phosphate, trioctyl phosphate, or tetrahydrofurfuryl oleate etc.

When manufacturing a lithographic printing plate or photoresist etc. using the negative type image recording material of the present invention, normally, manufacture is carried out by dissolving the various constituents (A)~(C) and other constituents if desired in a solvent to prepare an application liquid, then applying this application liquid on to a suitable carrier and drying. Solvents that may be used include for example ethylene dichloride, cyclohexanone, 2-heptanone, methyl ethyl ketone, methanol, ethanol, propanol, ethylene glycol monomethyl ether, ethylene glycol monoethyl ether, 1-methoxy-2-propanol, ethylene glycol monoethyl ether acetate, 2-methoxy ethyl acetate, 1-methoxy-2-propyl acetate, dimethoxyethane, ethyl acetate, methyl lactate, ethyl lactate, ethylethoxy propionate, methyl pyruvate, ethyl pyruvate, propyl pyruvate, N,N-dimethyl acetamide, ethyl methoxy propionate, N,N-dimethyl formamide, tetramethyl urea, N-methyl pyrrolidone, dimethyl sulfoxide, tetrahydrofuran, sulfolane, y-butyrolactone, toluene, and water etc., but there is no restriction to these. These solvents may be used alone or may be mixed.

Preferably the concentration of the constituents (A)~(C) (total solids including the other constituents) in the solvent is 1~50 weight %. Also, although the amount of the recording layer (solids) formed after application and drying varies depending on the use to which it is to be put, in the case of a lithographic printing plate it is normally preferably 0.5~5.0 g/m$^2$. If the application amount is small, the apparent sensitivity becomes large, but the film properties of the image recording film are impaired.

Various methods may be employed to apply the application liquid to the carrier. Examples which may be given are: bar coater application, rotary application, spray application, curtain application, dipping application, air knife application, blade application, or roller application.

Surfactants to improve applicability may be added to the negative type image recording material of the present invention, such as for example the fluorine-based surfactants disclosed in JP-A No. 62-170950. Preferably the added amount is 0.01~1 weight % in the total solids of the image recording material, and even more preferably is 0.05~0.5 weight %.

As carriers on which the application liquid containing the negative type image recording material of the present invention may be applied, any dimensionally stable sheet-form article may be employed, with no particular restriction. Examples that may be given include paper, plastics (for example polyethylene, polypropylene, polystyrene), laminated paper, metallic sheets (for example aluminum, zinc or copper) plastic films (for example cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetate), or metal-laminated or evaporated paper or plastic films as above.

As preferred carriers for a lithographic printing plate, there may be mentioned polyester film or aluminum sheet; of these, aluminum sheet is particularly preferred on account of its good dimensional stability and comparatively low cost. Suitable aluminum sheet may be pure aluminum sheet or alloy sheet whose main constituent is aluminum containing traces of other elements, or, further, aluminum laminated or evaporated plastics sheet. Other elements that may be contained in the aluminum alloy include silicon, iron, manganese, copper, magnesium, chromium, zinc, bismuth, nickel and titanium. The total content of other elements in the alloy is below 10 weight %. In particular an ideal form of aluminum is pure aluminum, but it is difficult to manufacture totally pure aluminum by refining technology, so it may contain small amounts of other elements. The composition of the aluminum sheet employed as a carrier is not specified, and aluminum sheet consisting of conventionally known and employed materials may be utilized. The thickness of the aluminum sheet employed in the present invention is roughly about 0.1 mm~0.6 mm, preferably 0.15 mm~0.4 mm, and particularly preferably 0.2 mm~0.3 mm.

When aluminum sheet is employed as a carrier, the aluminum sheet is preferably subjected to surface roughening. Prior to the surface roughening of the aluminum sheet, if required, in order to remove rolling oil from the surface, it may be subjected to de-greasing treatment using a surfactant, organic solvent or alkaline aqueous solution, for example.

The surface roughening treatment of the aluminum sheet surface may be performed by various methods. However, for example, it may be performed by a method of mechanical surface roughening, a method of dissolving and roughening the surface electrochemically, or a method of selectively dissolving the surface chemically. Mechanical methods include for example use of known methods such as the ball grinding method, brush grinding method, blast grinding method, or buff grinding method. Electrochemical surface roughening methods include methods using AC or DC in an hydrochloric acid or nitric acid electrolyte. Also, a method employing a combination of these two such as is disclosed in JP-A No. 54-63902 may be employed.

The aluminum sheet that has thus been surface-roughened may be subjected to anodic oxidation treatment in order to increase water retentivity and/or wear resistance of the surface, if required, after performing alkali etching treatment and neutralizing treatment if required. As the electrolyte used for anodic oxidation and treatment of the aluminum sheet, various electrolytes may be employed to form a porous oxide coating; typically, sulfuric acid, phosphoric acid, oxalic acid, chromic acid, or a mixture of these acids is employed. The concentration of these electrolytes may be suitably determined depending on the type of electrolyte. The treatment conditions for anodic oxidation cannot be generally specified since they vary depending on the electrolyte employed; however, typically, the electrolyte concentration is suitably 1~80 weight % solution, liquid temperature 5~70° C., current density 5~60 A/dm$^2$, Voltage 1~100 V, electrolysis time 10 seconds~5 minutes.

If the amount of anodic oxidized film is less than 1.0 g/m$^2$, printing resistance is insufficient, with the result that the non-image regions of the lithographic printing plate are easily damaged, as a result of which adhesion of the ink to the parts where damage has occurred during printing tends to produce so-called "scumming".

After subjection to anodic oxidation treatment, the aluminum surface is subjected, if necessary, to treatment to render it hydrophilic. A method of producing hydrophilic character employed in the present invention may be the alkali metal silicate method (for example, aqueous sodium silicate solution), as disclosed in U.S. Pat. No. 2,714,066, U.S. Pat. Nos. 3,181,461, 3,280,734 and 3,902,734. In this method, the carrier is subjected to immersion treatment or a electrolytic treatment in an aqueous sodium silicate solution. Apart from this, a method of treatment using potassium fluorozirconate disclosed in JP-B No. 36-22063, or of treatment using polyvinyl phosphoric acid as disclosed in U.S. Pat. Nos. 3,276,868, 4,153,461 and 4,689,272 etc. may be employed.

As preferred substrates for carriers for photoresists, mention may be made by way of example of glass substrates coated with silicon/silicon dioxide, or transparent substrates such as ITO substrates. These substrates may be subjected to surface treatment if desired.

An undercoat layer may be provided on the carrier. As the constituents of the undercoat layer, various organic compounds may be employed. For example, a selection may be made from: carboxymethylcellulose, dextrin, gum arabic, phosphonic acids having an amino group such as 2-aminoethylphosphonic acid, phenylphosphonic acid, which may have a substituent group, organic phosphonic acids such as naphthylphosphonic acid, and alkylphosphonic acids, glycerophosphonic acid, methylene phosphonic acid and ethylene diphosphonic acid, organic phosphoric acids such as phenylphosphoric acids, which may have a substituent group, naphthyl phosphoric acids, alkylphosphoric acid and glycerophosphoric acid, organic phosphinic acids such as a phenyl phosphinic acids, which may have a substituent group, naphthyl phosphinic acids, alkyl phosphinic acids and glycerophosphinic acids, amino acids such as glycine or β-alanine, and amine hydrochlorides having a hydroxyl group such as triethanolamine hydrochloride. Or mixtures of two or more of these may be employed. Also, diazonium compounds may preferably be employed as an undercoat. The amount of coating of the undercoat layer may suitably be 2~200 mg/m$^2$.

The image recording means of a lithographic printing plate or photoresist film etc. manufactured in this way is determined in accordance with the physical properties of the other constituents such as acid generating agent and/or sensitizer. For example in the case where an IR absorbent is included as sensitizer, it is preferable to perform image exposure using a solid-state laser that emits IR of wavelength 760 nm to 1200 nm and a semiconductor laser. When a negative type image recording material according to the present invention is illuminated with light etc. in the form of an image, by lasers of various types etc., acid is generated by the acid generating agent of (C) in the illuminated region, and this acid causes a cross-linkage reaction of compound (A) and polymer (B) to proceed, resulting in hardening of the illuminated region, thereby forming a latent image. After this, when development treatment is performed using an alkaline developing liquid, the non-illuminated region is dissolved in the developing liquid, whereas the hardened illuminated region is not dissolved; an image is thereby formed on the carrier.

Also, although, with the lithographic printing plate etc. using the negative type image recording material of the present invention, developing treatment may be performed immediately after laser irradiation, it is possible to perform heat treatment between the laser irradiation step and the developing step. The conditions when performing heat treatment are preferably in the range 60° C.~150° C., for 5 seconds~5 minutes. As the method of heating, conventionally known methods may be employed. Examples that may be given include heating using a panel heater or ceramic heater, and heating using a lamp. Specifically, the method disclosed in Japanese Patent Application No. 8-94197 may be employed. By means of this heat treatment, the amount of laser energy required for recording during laser irradiation can be reduced.

Also, image recording may be effected by supplying heat. When heat treatment in the form of an image is applied to the aforesaid lithographic printing plate or the like, this heat causes the acid generating agent (C) to generate acid and this acid causes a cross-linkage reaction with the binder (B) by the cross-linkage agent of (A) to be initiated and furthermore this cross-linkage reaction is promoted by heat. In contrast, when illumination with light in the form of an image is performed, the light causes the acid generating agent (C) to generate acid and this acid initiates a cross-linkage reaction with binder (B) by the cross-linkage agent (A); the cross-linkage reaction is further promoted by the heating that occurs together with the optical illumination. Even if this heating is somewhat more gentle in degree than when heat treatment is performed on its own as described above, an appreciable acceleration effect is exhibited.

If necessary, after the heat treatment has been performed, the lithographic printing plate etc. is preferably developed by water or an alkaline aqueous solution. If an alkaline aqueous solution is employed, the conventionally known alkaline aqueous solutions can be employed as developing liquid and top-up liquid. Examples that may be mentioned include inorganic alkali salts such as: sodium silicate, potassium silicate; sodium phosphate, potassium phosphate, ammonium phosphate; sodium hydrogen phosphate, potassium hydrogen phosphate, ammonium hydrogen phosphate; sodium carbonate, potassium carbonate, ammonium carbonate; sodium hydrogen carbonate, potassium hydrogen carbonate, ammonium hydrogen carbonate, sodium borate, potassium borate, ammonium borate; sodium hydroxide, ammonium hydroxide, potassium hydroxide and lithium hydroxide; and sodium metasilicate. Also, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine, tetramethyl ammonium hydroxide choline, or pyrrole may be mentioned.

These alkaline agents may be used alone or as a combination of two or more.

Of these alkaline agents, a particularly preferred example of a developing liquid is an aqueous solution of a silicate such as sodium silicate or potassium silicate. The reason is that adjustment of developing properties can be achieved by means of the ratio and concentration of silicon oxide $SiO_2$ and alkali metal oxide $M_2O$ which are the constituents of the silicate. For example, the alkali metal silicates disclosed in JP-A No. 54-62004 or JP-B No. 57-7427 may be effectively employed.

Furthermore, as is known, in the case of development using an automatic developer, a large quantity of lithographic printing plates can be processed without needing to change the developing liquid in the developing tank for a long time, by adding an aqueous solution (top-up liquid) of a higher degree of alkalinity than the developing liquid to the developing liquid. In the case of the present invention also, this top-up system is preferably applied.

Various surfactants or organic solvents etc. may be added if required to the developing liquid and top-up liquid, with the object of promoting or inhibiting developing, or of dispersing developing gas or raising the ink affinity of the image regions of the printing plate. As examples of preferred surfactants, there may be mentioned anionic surfactants, cationic surfactants, non-ionic surfactants, and amphoteric surfactants. As a preferred organic solvent, benzyl alcohol etc. may be mentioned. Also, addition of polyethylene glycol or a derivative thereof, or polypropylene glycol or a derivative thereof is desirable.

Furthermore, if necessary, to the developing liquid or top-up liquid, there may be added hydroquinone, resorcinol, inorganic salt-based reducing agents such as sodium or potassium sulfite or hydrogensulfite, or organic carboxylic acids, defoaming agents, or water softeners.

As a developing liquid including such surfactants, organic solvents and reducing agents etc., there may be mentioned by way of example the developing liquid composition comprising benzyl alcohol, anionic surfactant, alkaline agent and water described in JP-A No. 51-77401; the developing liquid composition comprising benzyl alcohol, anionic surfactant, and aqueous solution containing a water-soluble sulfite disclosed in JP-A No. 53-44202; or the developing liquid composition containing an organic solvent whose solubility in water is under 10 weight % at normal temperature, an alkaline agent, and water disclosed in JP-A No. 55-155355; these may be suitably employed in the present invention.

A printing plate that has been subjected to developing treatment using the developing liquid and top-up liquid described above is subjected to post-treatment using a rinsing solution containing washing water and surfactant etc., and desensitizing liquid containing gum arabic and/or a starch derivative. These treatments may be combined in various ways for the post-treatment when an image recording material according to the present invention is used as a printing plate.

In recent years, with the object of rationalizing and standardizing the plate making operation, automatic developers for printing plates have been widely used in the plate making and printing industries. Such automatic developers typically comprise a developing unit and post-treatment unit, comprising a device for feeding a printing plate for printing, tanks for the various treatment liquids, and a spray device; developing treatment is performed by spraying of the various treatment liquids that have been sucked up by means of a pump from spray nozzles whilst the exposed printing plate is fed horizontally. Also, recently there has become known a method in which treatment is performed by immersing and feeding a printing plate for printing, using in-liquid guide rolls etc., in a treatment liquid tank that is filled with treatment liquid. In such automatic treatment, treatment can be performed while replenishing the top-up liquid in accordance with the amount of treatment in each treatment liquid and the operating time etc.

A so-called throwaway treatment system may also be employed, in which treatment is performed using substantially unused treatment liquid.

Lithographic printing plates obtained as above may be supplied to a printing step after applying desensitizing gum as required, but, if it is desired to obtain lithographic printing plates having even better resistance to printing, burning treatment is performed.

When a lithographic printing plate is to be subjected to burning treatment, prior to burning treatment, it is preferably treated by counter-etching liquid as described in JP-B No. 61-2518, JP-B No. 55-28062, JP-A No. 62-31859, or JP-A No. 61-159655.

This may be done by applying this counter-etching liquid onto the lithographic printing plate using a sponge or degreased cotton soaked in this liquid, immersing the printing plate into a vat filled with counter-etching liquid, or by application using an automatic coater. Also, even better results are obtained by making the applied amount uniform after application, by using a squeegee or squeegee roller.

Suitably, the applied amount of counter-etching liquid is typically 0.03~0.8 $g/m^2$ (dry weight).

After the lithographic printing plate to which counter-etching liquid has been applied has, if necessary, been dried, it is heated to high temperature in a burning processor (for example the burning processor BP-1300 marketed by Fuji Photographic Film Inc). The heating temperature and time to be used depend on the type of constituents used to form the image, but are desirably in the range 180~300° C., in the range 1~20 minutes.

The lithographic printing plate that has been subjected to burning treatment may if required be subjected to a suitable conventional treatments such as washing with water and gum spreading; however, if a counter-etching liquid containing for example a water-soluble polymer compound is employed, so-called sensitization treatment such as gum spreading may be dispensed with.

EXAMPLES

The present invention is further described in detail with reference to the following Examples. However the present invention is not restricted by the following Examples.

Compound (A)

Compounds II-(b)-(i)-1, III-(b)-18, III-(b)-(iii)-1 and II-(b)-(iv)-5 referred to above by way of example were synthesized as follows.

Synthesis of II-(b)-(i)-1

Into a flask of 100 ml capacity fitted with a stirring device and cooling tube, there were introduced, on a water/ice bath, 9.41 g (0.05 mol) of azelaic acid, and 34.00 g (0.10 mol) of an aqueous solution of sodium hydroxide (NaOH 3 g/water 30 g); in addition, there were added 15.26 g (0.10 mol) of 4-(chloromethyl) styrene, 8.30 g (0.05 mol) of potassium iodide, and 30 ml of dimethyl acetamide; the ice-water bath was then removed, and heating was performed to 90° C., followed by stirring for 3 hours to perform the reaction. After completion of the reaction, the reaction liquid was returned to room temperature and thrown into ice-water, to obtain a yellow solid. This yellow solid was purified by re-crystallization using ethanol and water, to obtain 11.0 g of white powder. The fact that the target compound had been obtained was confirmed by NMR and IR measurements.

Synthesis of III-(b)-18

Into a flask of 100 ml capacity fitted with a stirring device and cooling tube, there were introduced on an ice-water bath 10.5 g (0.05 mol) of 1,3,5-benzene tricarbonic acid and 49.50 g (0.15 mol) of aqueous sodium hydroxide solution (NaOH 4.5 g/water 45 g). Further, there were added 22.89 g (0.15 mol) of 4-(chloromethyl) styrene, 12.45 g (0.08 mol) of potassium iodide, and 30 ml of dimethyl acetamide. The ice-water bath was then removed, and the reaction liquid was heated to 90° C., and stirred for 5 hours to perform the reaction. After completion of the reaction, the reaction liquid was returned to room temperature, and thrown into ice-water, to obtain a light yellow solid. This light yellow solid was purified by re-crystallization from ethanol and water, to obtain 12.50 g of white powder. This was confirmed to be the target compound by NMR and IR measurements.

Synthesis of II-(b)-(iii)-1

Into a flask of capacity 100 ml fitted with a stirrer and cooling tube, on an ice-water bath, there were introduced 6.0 g (0.05 mol) of 4-hydroxystyrene, and 16.50 g (0.05 mol) of an aqueous solution of sodium hydroxide (NaOH 1.5 g/water 15 g). Further, 8.2 g (0.025 mol) of 1,12-dibromododecane and 30 ml of dimethylacetamide were added, the ice-water bath was removed, and the reaction liquid was heated to 90° C., and was stirred for 5 hours, to perform the reaction. After completion of the reaction, the reaction liquid was returned to room temperature and 100 ml of water were thrown in. The product was then extracted with 100 ml of ethyl acetate. The extracted liquid was dried using magnesium sulfate, and then concentrated under reduced pressure. When the product was purified by column chromatography using silica gel, 10.7 g of product were obtained; this was confirmed to be the target product by NMR and IR measurements.

Synthesis of II-(b)-(iv)-5

Into a flask of capacity 300 ml fitted with a stirrer and cooling tube there were introduced on an ice-water bath 5.95 g (0.05 mol) of 4-vinylaniline, and 100 ml of a tetrahydrofuran solution of 5.05 g (0.05 mol) of triethylamine. In addition, there are added dropwise 30 ml of a tetrahydrofuran solution of 5.08 g (0.025 mol) of terephthaloyl chloride. After stirring for 30 minutes, the produced solid was filtered off. The filtrate was concentrated under reduced pressure and the obtained solid was re-crystallized using acetone and hexane, whereupon 8.7 g of solid were obtained; this was confirmed to be the target compound by NMR and IR measurements.

Lithographic printing plates α-1~α-40 comprising the constituents indicated in Table 1 below were manufactured using the synthesized chemical compounds. The structure and method of synthesis of the constituents illustrated in Table 1 below and the method of manufacture of the lithographic printing plate are illustrated below.

Polymer (B)

BX-1

"Marukarinka MH2P" (trade name, manufactured by Maruzen Petrochemical Company) was used. This Polymer has the same structure as the example Polymer BP-1 referred to above.

BX-2

A formalin-condensed novolak resin of m-cresol/p-cresol (60 weight %/40 weight %) was manufactured. The weight average molecular weight of this novolak resin was 10,000, and the number average molecular weight was 6000.

BX-3

Into a flask of 500 ml capacity fitted with a stirrer and cooling tube, there were introduced 7.2 g (corresponding to 0.21 mol) of an oil dispersion of NaH and 50 ml of tetrahydrofuran, and the mixture was stirred on an ice-water bath. Into this mixture there was added dropwise, little by little, a solution in which 24.60 g (0.21 mol) of indole were dissolved in 100 ml of tetrahydrofuran. After completion of the dropwise addition, the ice-water bath was removed and the mixture was stirred for one hour at room temperature. Then, 49.29 g (0.21 mol) of 2-chloroethyl-p-toluene sulfonate were added, and the reaction performed under heated reflux whilst stirring for 15 hours. After completion of the reaction, the undissolved material was removed by filtration, and concentration was performed under reduced pressure. This reaction mixture was purified by column chromatography using silica gel, to obtain 15.4 g of 1-(2-chloroethyl) indole.

Next, to a flask of 200 ml capacity fitted with a stirrer and cooling tube, there were introduced 15.4 g of 1-(2-chloroethyl)indole, 21.3 g of potassium methacrylate, 7.1 g of potassium iodide, 40 ml of N,N-dimethyl formamide and a small amount of hydroquinone. The mixture was heated to 100° C. and was stirred for 2.5 hours. After completion of the reaction, the insoluble material was removed by filtration, and concentration was performed under reduced pressure. This reaction mixture was then purified by column chromatography using silica gel, to obtain 15.5 g of 1-(2-methacryloyloxyethyl)indole.

Furthermore, into a flask of 100 ml capacity fitted with a stirrer and cooling tube, there were introduced 14.75 g of 1-methoxy-2-propanol, and heated to 75° C. under a current of nitrogen gas. Whilst stirring the contents of this flask, there was added dropwise over 2.5 hours a mixture of 11.28 g of 1-(2-methacryloyloxyethyl)indole, 1.36 g of methacrylic acid, 0.0748 g of V-601 (trade name: azo polymerization initiator, manufactured by Wako Junyaku Co. Ltd.), and 14.75 g of 1-methoxy-2-propanol. After completion of the dropwise addition, 0.0748 g of V-601 was again added, and stirring was carried out for 3 hours at 75° C. After completion of the reaction, the mixture was cooled to room temperature and 50 ml of methanol added, and was introduced into 1 liter of water and then stirred. The precipitate was collected by filtration and dried under reduced pressure to obtain 12.6 g of BX-3. When the weight average molecular weight was measured by GPC, it was found to be 54,000 (polystyrene standard).

BX-4

Into a flask of 500 ml capacity fitted with a stirrer and cooling tube, there were introduced 7.2 g (corresponding to 0.21 mol) of an oil dispersion of NaH, and 50 ml of tetrahydrofuran, and stirred on an ice-water bath. To this mixture there was added dropwise, a little at a time, a solution of 30.87 g (0.21 mol) of 5-methoxyindole dissolved in 100 ml of tetrahydrofuran. After completion of the dropwise addition, the ice-water bath was removed and the mixture was cooled for one hour at room temperature. Then, 49.29 g (0.21 mol) of 2-chloroethyl-p-toluene sulfonate were added, and reacted for 15 hours while stirring, heating under reflux. After completion of the reaction, the insoluble material was removed by filtration, and concentration was performed under reduced pressure. The reaction mixture was then purified by column chromatography using silica gel, to obtain 15.7 g of 1-(2-chloroethyl)-5-methoxyindole.

Next, into a flask of 200 ml capacity fitted with a stirrer and cooling tube, there were introduced 15.7 g of 1-(2-chloroethyl)-5-methoxyindole, 18.6 g of potassium methacrylate, 6.2 g of potassium iodide, 40 ml of N,N-dimethylsulfoxide, and a small amount of hydroquinone. They were heated to 100° C., and stirred for 2.5 hours. After completion of the reaction, the insoluble material was removed by infiltration, and concentration was performed under reduced pressure. Further, this reaction mixture was purified by column chromatography using silica gel, to obtain a 16.8 g of 1-(2-methacryloyloxyethyl)-5-methoxyindole.

Further, into a flask of 100 ml capacity fitted with a stirrer and cooling tube, there were introduced 16.92 g of 1-methoxy-2-propanol, and heated to 75° C. under a current of nitrogen. Whilst stirring the contents of this flask, there was added dropwise over 2.5 hours a mixture of 12.69 g of 1-(2-methacryloyloxyethyl)-5-methoxyindole, 1.81 g of methacrylic acid, 0.0804 g of V-601 (trade name for azo polymerization initiator manufactured by Wako Junyaku Company), and 16.92 g of 1-methoxy-2-propanol. After completion of the dropwise addition, 0.0804 g of V-601 was again added, and was stirred for 3 hours at 75° C.; after completion of the reaction, the reaction liquid was cooled to room temperature, 50 ml of methanol were added, and it was introduced into 1 liter of water while stirring. The precipitate was collected by filtration and dried under reduced pressure, to obtain 13.1 g of BX-4. The weight average molecular weight was measured by GPC, and was found to be 52,000 (polystyrene standard).

BX-5

Into a flask of 500 ml capacity fitted with a stirrer and cooling tube, there were introduced 7.2 g (corresponding to 0.21 mol) of an NaH oil dispersion, and 50 ml of tetrahydrofuran. The mixture was stirred on an ice-water bath. To this mixture was added, dropwise, little by little, a solution of 34.02 g of 4-nitroindole (0.21 mol) dissolved in 100 ml of tetrahydrofuran. After completion of the dropwise addition, the ice-water bath was removed and the mixture was stirred for one hour at room temperature. Then, 49.29 g (0.21 mol) of 2-chloroethyl-p-toluenesulfonate were added, and was reacted for 10 hours while stirring, heating under reflux. After completion of the reaction, the insoluble material was removed by filtration, and concentration was performed under reduced pressure. Further, this reaction mixture was purified by column chromatography using silica gel, to obtain 14.9 g of 1-(2-chloroethyl)-4-nitroindole.

Next, into a flask of 200 ml capacity fitted with a stirrer and cooling tube, there were introduced 14.9 g of 1-(2-chloroethyl)-4-nitroindole, 18.0 g of potassium methacrylate, 6.0 g of potassium iodide, 40 ml of N,N-methyl formamide and a small quantity of hydroquinone, these then being heated to 100° C., and stirred for 2.5 hours. After the reaction had been completed, insoluble material was removed by filtration, and concentration was performed under reduced pressure. Furthermore, this reaction mixture was purified by column chromatography using silica gel, to obtain 16.8 g of 1-(2-methacryloyloxyethyl)-4-nitroindole.

Furthermore, into a flask of 100 ml capacity fitted with a stirrer and cooling tube, there were inserted 17.78 g of 1-methoxy-2-propanol, and heated to 75° C. under a current of nitrogen. While stirring the contents of this flask, a mixture of 14.9 g of 1-(2-methacryloyloxyethyl)-4-nitroindole, 1.81 g of methacrylic acid, and 0.0804 g of V-601 (trade name for azo polymerization initiator manufactured by Wako Junyaku Co. Ltd.) and 17.78 g of 1-methoxy-2-propanol was added dropwise over 2.5 hours. After completion of the dropwise addition, 0.0804 g of V-601 was further added, and stirring was performed for 3 hours at 75° C. After completion of the reaction, the reaction liquid was cooled to room temperature, 50 ml of methanol were added, and it was introduced into 1 liter of water while stirring. The precipitate was collected by filtration, and dried under reduced pressure, to obtain 13.1 g of BX-5. When the weight average molecular weight was measured by GPC, it was found to be 50,000 (polystyrene standard).

Acid Generating Agent (C)

Acid generating agents of the following structure were employed.

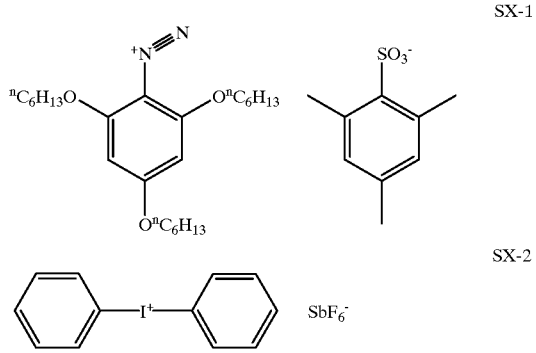

Sensitizer (D)

IR absorbents of the following structure were used as sensitizer.

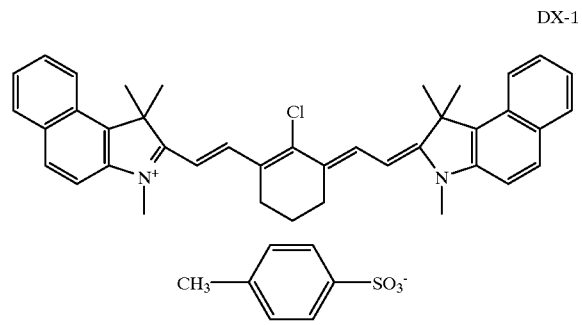

Manufacture of Lithographic printing Plate

Example

An aluminum sheet (material grade 1050) of thickness 0.30 mm was degreased by washing with trichloroethylene, after which its surface was sanded, using a nylon brush and 400 mesh Pumistone (trade name for sandblasting agent manufactured by Kyoritsu Yogyo)-water suspension, then washed well with water. This sheet was etched by immersing for 9 seconds in an aqueous solution of 25% sodium hydroxide at 45° C. and was washed with water, then furthermore immersed in 2% $HNO_3$ for 20 seconds and washed with water. The etched amount of the sanded surface was about 3 $g/m^2$. Next, this sheet was provided with a DC anodic oxide film of 3 $g/m^2$ at current density of 15 $A/dm^2$, using as electrolyte 7% $H_2SO_4$, then washed with water and dried. Next, an undercoat liquid of the following composition was applied to this aluminum sheet, and dried for 30 seconds at 80° C. The amount of coating after drying was 10 $mg/m^2$.

| Coating liquid | |
|---|---|
| β-alanine | 0.1 g |
| Phenylphosphonic acid | 0.05 g |
| Methanol | 40 g |
| Pure water | 60 g |

A negative type lithographic printing plate was manufactured by applying recording layer application liquid of the following composition to this carrier, and drying for one minute at 100° C. The weight of the recording layer after drying was 1.4 $g/m^2$.

| Recording layer application liquid | |
|---|---|
| Compound (A) (indicated in Table 1 below) | 0.6 g |
| Polymer (B) (indicated in Table 1 below) | 1.4 g |
| Acid generating agent (C) (indicated in Table 1 below) | 0.2 g |
| IR absorbent (indicated in Table 1 below) | 0.2 g |
| Coloring agent (trade name "VPB-Naps": manufactured by Hodogaya Company Ltd.) | 0.04 g |
| Fluorine-based surfactant (trade name "MEGAFAC F-177PF", manufactured by Dai Nippon Inki Kagaku Kogyo Company Ltd.) | 0.03 g |
| Solvent: methyl ethyl ketone | 1.2 g |
| Solvent: methyl alcohol | 15.8 g |
| Solvent: 1-methoxy-2-propanol | 10.0 g |

TABLE 1

| Example | (A) Crosslinking agent | (B) Binder | (C) Acid generating agent | IR absorbent | Energy required for recording (mJ/cm$^2$) | Change of energy over time (mJ/cm$^2$) | Coefficient of resistance to printing |
|---|---|---|---|---|---|---|---|
| α-1 | II-b-(i)-1 | BX-1 | SX-1 | DX-1 | 170 | 5 | 200 |
| α-2 | II-b-(iii)-1 | BX-1 | SX-1 | DX-1 | 160 | 10 | 210 |
| α-3 | II-b-(iv)-5 | BX-1 | SX-1 | DX-1 | 165 | 10 | 220 |
| α-4 | III-b-18 | BX-1 | SX-1 | DX-1 | 160 | 15 | 250 |
| α-5 | II-b-(i)-1 | BX-1 | SX-2 | DX-1 | 170 | 5 | 200 |
| α-6 | II-b-(iii)-1 | BX-1 | SX-2 | DX-1 | 160 | 10 | 210 |
| α-7 | II-b-(iv)-5 | BX-1 | SX-2 | DX-1 | 160 | 10 | 220 |
| α-8 | III-b-18 | BX-1 | SX-2 | DX-1 | 160 | 15 | 240 |
| α-9 | II-b-(i)-1 | BX-2 | SX-1 | DX-1 | 170 | 10 | 200 |
| α-10 | II-b-(iii)-1 | BX-2 | SX-1 | DX-1 | 160 | 10 | 210 |
| α-11 | II-b-(iv)-5 | BX-2 | SX-1 | DX-1 | 165 | 10 | 230 |
| α-12 | III-b-18 | BX-2 | SX-1 | DX-1 | 160 | 15 | 240 |
| α-13 | II-b-(i)-1 | BX-2 | SX-2 | DX-1 | 170 | 10 | 190 |
| α-14 | II-b-(iii)-1 | BX-2 | SX-2 | DX-1 | 160 | 10 | 200 |
| α-15 | II-b-(iv)-5 | BX-2 | SX-2 | DX-1 | 165 | 10 | 220 |
| α-16 | III-b-18 | BX-2 | SX-2 | DX-1 | 160 | 15 | 230 |
| α-17 | II-b-(i)-1 | BX-3 | SX-1 | DX-1 | 165 | 10 | 200 |
| α-18 | II-b-(iii)-1 | BX-3 | SX-1 | DX-1 | 160 | 15 | 220 |
| α-19 | II-b-(iv)-5 | BX-3 | SX-1 | DX-1 | 160 | 15 | 230 |
| α-20 | III-b-18 | BX-3 | SX-1 | DX-1 | 155 | 15 | 250 |
| α-21 | II-b-(i)-1 | BX-3 | SX-2 | DX-1 | 165 | 10 | 200 |
| α-22 | II-b-(iii)-1 | BX-3 | SX-2 | DX-1 | 160 | 15 | 210 |
| α-23 | II-b-(iv)-5 | BX-3 | SX-2 | DX-1 | 160 | 15 | 230 |
| α-24 | III-b-18 | BX-3 | SX-2 | DX-1 | 155 | 15 | 250 |
| α-25 | II-b-(i)-1 | BX-4 | SX-1 | DX-1 | 160 | 15 | 220 |
| α-26 | II-b-(iii)-1 | BX-4 | SX-1 | DX-1 | 150 | 15 | 220 |
| α-27 | II-b-(iv)-5 | BX-4 | SX-1 | DX-1 | 160 | 15 | 225 |
| α-28 | III-b-18 | BX-4 | SX-1 | DX-1 | 150 | 15 | 260 |
| α-29 | II-b-(i)-1 | BX-4 | SX-2 | DX-1 | 165 | 10 | 230 |
| α-30 | II-b-(iii)-1 | BX-4 | SX-2 | DX-1 | 170 | 15 | 230 |
| α-31 | II-b-(iv)-5 | BX-4 | SX-2 | DX-1 | 165 | 10 | 230 |
| α-32 | III-b-18 | BX-4 | SX-2 | DX-1 | 160 | 15 | 260 |
| α-33 | II-b-(i)-1 | BX-5 | SX-1 | DX-1 | 165 | 10 | 200 |
| α-34 | II-b-(iii)-1 | BX-5 | SX-1 | DX-1 | 165 | 10 | 210 |
| α-35 | II-b-(iv)-5 | BX-5 | SX-1 | DX-1 | 165 | 10 | 200 |
| α-36 | III-b-18 | BX-5 | SX-1 | DX-1 | 160 | 15 | 220 |
| α-37 | II-b-(i)-1 | BX-5 | SX-2 | DX-1 | 165 | 10 | 200 |
| α-38 | II-b-(iii)-1 | BX-5 | SX-2 | DX-1 | 170 | 10 | 200 |
| α-39 | II-b-(iv)-5 | BX-5 | SX-2 | DX-1 | 170 | 10 | 210 |
| α-40 | III-b-18 | BX-5 | SX-2 | DX-1 | 180 | 15 | 230 |

The lithographic printing plates of α-1~α-40 that were thus obtained were scanned and exposed by a semiconductor laser emitting IR of wavelength about 830~850 nm. After exposure, they were subjected to heat treatment for 15 seconds at 110° C., using a panel heater, then developed using a developing liquid manufactured by Fuji Photographic Film Company Ltd., trade name DP-4 (1:8 water-diluted solution). The amount of energy required for recording was then calculated from the line width of the image obtained, the laser output, the loss of the optical system and the scanning speed.

Also, in order to investigate storage stability, a printing plate prior to laser exposure was left for three days under high-temperature conditions (60° C.) and the amount of energy required for recording was then calculated by performing laser exposure in the same way as described above for the printing plate that had been stored under high-temperature conditions, and the difference of the amounts of energy before and after the lapse of time was found. A difference of substantially less than 20 mJ/cm$^2$ was evaluated as desirable in manufacture and giving excellent storage stability.

Furthermore, an evaluation of coefficient of resistance to printing was performed by taking a printing plate on which an image had been formed by laser exposure, heating with a heater, and completing development and using this to perform repeated printing in a printer. The respective final numbers of printed sheets being then ascertained and used to evaluate a coefficient of resistance to printing, expressed as a relative value, taking Comparative Example 1 below as the standard value (100). Regarding the demanded performance, a level of 180 or better was evaluated as a level presenting no practical problems. The final number of printed sheets means the number of sheets before the film thickness of the photosensitive layer of the printing plate was diminished, with local failure of the ink to adhere i.e. so-called printing plate failure occurs.

The results of these evaluations are shown in combination in Table 1.

Comparative Examples

Lithographic printing plates α-41~α-49 were manufactured and evaluated in the same way as the Examples, apart from altering the compounds (A) used in the Examples to the compounds shown in Table 2.

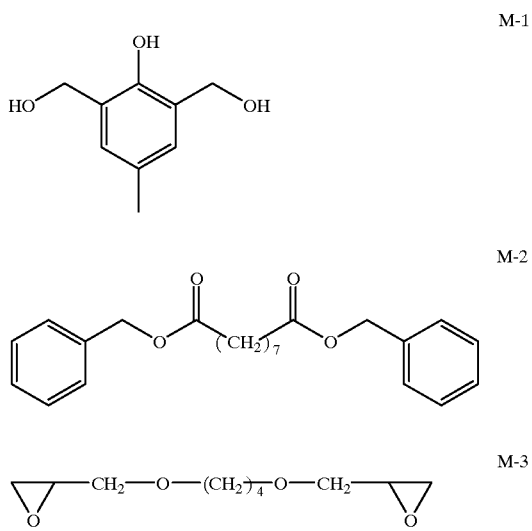

From the results of evaluation of Table 1 and Table 2, it can be seen that, for the lithographic printing plates α-1~α-40 constituting the Examples, in all cases recording could be performed with energy of less than 170 m J/cm$^2$. Sensitivities, resistances to printing and storage stabilities of α-1~α-40 were markedly superior in comparison with the lithographic printing plates of Comparative Examples α-41~α-49, which contained cross-linkage agents but not included a styrene group.

Photoresist

Examples

Photoresist film application liquids of the following compositions were prepared.

| | |
|---|---|
| Compound (A) (shown in Table 3 below) | 0.08 g |
| Polymer (B) (shown in Table 3 below) | 1.41 g |
| Acid generating agent (C) (shown in Table 3 below) | 0.11 g |
| Solvent: propylene glycol/monomethyl acetate | 8.4 g |

The structure of the acid generating agent SX-3 employed is shown below.

TABLE 2

| | | | | | Evaluation | | |
|---|---|---|---|---|---|---|---|
| Example | (A) Crosslinking agent | (B) Binder | (C) Acid generating agent | IR absorbent | Energy required for recording (mJ/cm$^2$) | Change of energy over time (mJ/cm$^2$) | Coefficient of resistance to printing |
| α-41 | M-1 | BX-1 | SX-1 | DX-1 | 180 | 20 | 100 |
| α-42 | M-2 | BX-1 | SX-1 | DX-1 | * | — | — |
| α-43 | M-1 | BX-1 | SX-2 | DX-1 | 180 | 20 | 100 |
| α-44 | M-1 | BX-2 | SX-1 | DX-1 | 180 | 25 | 90 |
| α-45 | M-1 | BX-3 | SX-1 | DX-1 | 180 | 30 | 90 |
| α-46 | M-1 | BX-4 | SX-1 | DX-1 | 175 | 35 | 110 |
| α-47 | M-1 | BX-5 | SX-1 | DX-1 | 185 | 30 | 100 |
| α-48 | M-3 | BX-1 | SX-1 | DX-1 | 170 | 50 | 170 |
| α-49 | M-3 | BX-3 | SX-1 | DX-1 | 160 | 55 | 180 |

*No image was recorded.

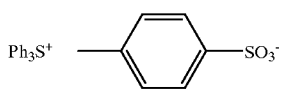

SX-3

The photoresist film application liquid that was prepared was filtered using a 0.2 μm filter, and applied onto a silicon wafer using a spin coater, then dried with a vacuum adsorption type hot-plate for 90 seconds at 120° C., to manufacture a photoresist film of thickness 0.83 μm.

The photoresist films β-1~β-20 that were thus manufactured were respectively irradiated using an electron beam line drawing device (accelerating voltage 50 KeV). After irradiation, they were respectively heated for 60 seconds using a vacuum adsorption type hot-plate at 110° C., immersed for 60 seconds in an aqueous solution of 2.38% tetramethyl ammnonium hydroxide (TMAH), rinsed with water for 30 seconds, and dried. The cross-sectional shape of the pattern obtained was observed using a scanning electron microscope. The sensitivity was taken as the irradiation energy when 0.20 μm lines (line:space=1:1) were resolved; the resolution was taken as being the resolution limit at this amount of irradiation (resolution at which the line and space were distinguished). The resolving power was taken as being the resolving power at the limit where 0.20 micron lines (line:space=1:1) are not resolved; the radiation energy under these conditions was taken as the sensitivity.

Also, the storage stability was evaluated by leaving the solution of photoresist composition to stand for one month at room temperature after preparation, measuring the sensitivity in the same way as described above, and ascertaining the change in sensitivity before and after storage. Cases where the sensitivity scarcely showed any change between before and after storage are indicated by ○; cases where there was a change in sensitivity before and after storage are indicated by X.

The evaluation results are shown in Table 3.

TABLE 3

| Example | (A) Cross-linking agent | (B) Binder | (C) Acid generating agent | Evaluation | | |
|---|---|---|---|---|---|---|
| | | | | Sensitivity (μC/cm²) | Resolution (μm) | Storage stability |
| β-1 | II-b-(i)-1 | BX-1 | SX-3 | 14 | 0.14 | ○ |
| β-2 | II-b-(iii)-1 | BX-1 | SX-3 | 14 | 0.14 | ○ |
| β-3 | II-b-(iv)-5 | BX-1 | SX-3 | 13 | 0.15 | ○ |
| β-4 | III-b-18 | BX-1 | SX-3 | 11 | 0.14 | ○ |
| β-5 | II-b-(i)-1 | BX-2 | SX-3 | 15 | 0.13 | ○ |
| β-6 | II-b-(iii)-1 | BX-2 | SX-3 | 15 | 0.14 | ○ |
| β-7 | II-b-(iv)-5 | BX-2 | SX-3 | 14 | 0.14 | ○ |
| β-8 | III-b-18 | BX-2 | SX-3 | 12 | 0.13 | ○ |
| β-9 | II-b-(i)-1 | BX-3 | SX-3 | 14 | 0.14 | ○ |
| β-10 | II-b-(iii)-1 | BX-3 | SX-3 | 13 | 0.15 | ○ |
| β-11 | II-b-(iv)-5 | BX-3 | SX-3 | 13 | 0.14 | ○ |
| β-12 | III-b-18 | BX-3 | SX-3 | 11 | 0.13 | ○ |
| β-13 | II-b-(i)-1 | BX-4 | SX-3 | 12 | 0.13 | ○ |
| β-14 | II-b-(iii)-1 | BX-4 | SX-3 | 12 | 0 12 | ○ |
| β-15 | II-b-(iv)-5 | BX-4 | SX-3 | 12 | 0.12 | ○ |
| β-16 | III-b-18 | BX-4 | SX-3 | 10 | 0.11 | ○ |
| β-17 | II-b-(i)-1 | BX-5 | SX-3 | 14 | 0.13 | ○ |
| β-18 | II-b-(iii)-1 | BX-5 | SX-3 | 14 | 0.14 | ○ |
| β-19 | II-b-(iv)-5 | BX-5 | SX-3 | 15 | 0.15 | ○ |
| β-20 | III-b-18 | BX-5 | SX-3 | 12 | 0.13 | ○ |

Comparative Examples

Photoresist films β-21~β-35 were prepared in the same way as in the case of the Examples, apart from changing the compounds (A) used in the Examples to the compounds used in Table 4, and evaluated in the same way.

TABLE 4

| Comparative example | (A) Cross-linking agent | (B) Binder | (C) Acid generating agent | Evaluation | | |
|---|---|---|---|---|---|---|
| | | | | Sensitivity (μC/cm²) | Resolution (μm) | Storage stability |
| β-21 | N-1 | BX-1 | SX-3 | * | — | — |
| β-22 | N-2 | BX-1 | SX-3 | 30 | 0.20 | X |
| β-23 | N-3 | BX-1 | SX-3 | 20 | 0.18 | X |
| β-24 | N-1 | BX-2 | SX-3 | * | — | — |
| β-25 | N-2 | BX-2 | SX-3 | 33 | 0.21 | X |
| β-26 | N-3 | BX-2 | SX-3 | 20 | 0.19 | X |
| β-27 | N-1 | BX-3 | SX-3 | * | — | — |
| β-28 | N-2 | BX-3 | SX-3 | 33 | 0.21 | X |
| β-29 | N-3 | BX-3 | SX-3 | 18 | 0.18 | X |
| β-30 | N-1 | BX-4 | SX-3 | * | — | — |
| β-31 | N-2 | BX-4 | SX-3 | 28 | 0.20 | X |
| β-32 | N-3 | BX-4 | SX-3 | 19 | 0.19 | X |
| β-33 | N-1 | BX-5 | SX-3 | * | — | — |
| β-34 | N-2 | BX-5 | SX-3 | 35 | 0.21 | X |
| β-35 | N-3 | BX-5 | SX-3 | 19 | 0.19 | X |

*no image was recorded.

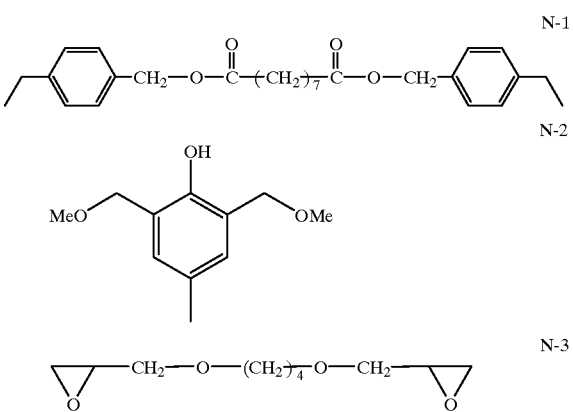

From the evaluation results of Table 3 and Table 4, it can be seen that the resist films of β-1~β-20 constituting the Examples were of superior sensitivity, resolving power, and storage stability compared with the photoresist films of Comparative Examples β-21~β-35, which contained cross-linking agents but not contained styrene groups.

With the present invention, negative type image recording materials can be provided that are capable of direct image recording from digital data provided by a computer etc., by recording using various types of laser etc. Also, a negative type image recording material can be provided which, when used as a lithographic printing plate, has good sensitivity, high resistance to printing, and excellent storage stability. Also, a negative type image recording material can be provided which, when used as a photoresist material, has high sensitivity and excellent resolving power and storage stability.

What is claimed is:

1. A method for negative image recording that comprises steps of:
   exposing a negative image recording material to energetic radiation or an electron beam;
   heating the negative image recording material at 60° to 150° C. for 5 seconds to 5 minutes; and
   developing the negative image recording material, wherein the negative image recording material comprises (A) a compound having at least one group represented by general formula (1) below, (B) a polymer capable of reacting with compound (A) in the presence of acid, and (C) a compound that generates acid in response to a supply of energetic radiation or an electron beam, or heat:

general formula (1)

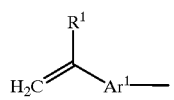

wherein $Ar^1$ represents an arylene group, and $R^1$ represents hydrogen or an alkyl group having 1~6 carbon atoms.

2. The method for negative image recording according to claim 1 wherein said compound (A) is a multi-functional compound having two or more groups represented by said general formula (1).

3. The method for negative image recording of claim 1 wherein said compound (A) is represented by the following general formula (2):

general formula (2)

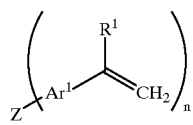

wherein $Ar^1$ and $R^1$ have the same meaning as in general formula (1); n is an integer selected from 1~20; Z is an n-valent linkage group, any group selected from the following set of divalent groups, or an n-valent group containing a divalent group combined with two or more groups selected from the following set of divalent groups

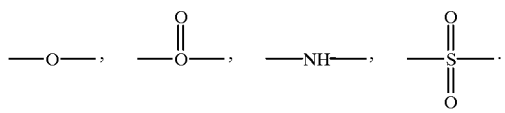

4. The method for negative image recording according to claim 3 wherein the compound represented by said general formula (2) is a compound having two or more styrene groups.

5. The method for negative image recording according to claim 3 wherein in the compound represented by said general formula (2), the linkage group Z has a hetero atom.

6. The method for negative image recording according to claim 1 wherein said compound (C) is selected from onium salts.

7. The method for negative image recording according to claim 1 wherein said compound (C) is selected from the group consisting of an iodonium salt, a sulfonium salt, a phosphonium salt, and a diazonium salt.

8. The method for negative image recording according to claim 1 containing an IR absorbent and capable of heat mode image recording.

9. The method for negative image recording according to claim 1 wherein said polymer (B) is selected from (1) polymers comprising structural units represented by general formula (3) below, (2) phenol resins, and (3) polymers having in their structure a heterocyclic ring having an unsaturated bond in the ring:

general formula (3)

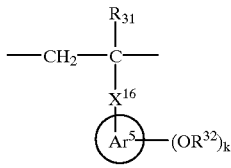

wherein $Ar^5$ represents a benzene ring, naphthalene ring, or anthracene ring; $R^{31}$ represents a hydrogen atom or a methyl group; $R^{32}$ represents a hydrogen atom or an alkyl group having 20 carbon atoms or less; $X^{16}$ contains a single bond or one or more atoms selected from C, H, N, O and S, and divalent linkage groups having 0~20 carbon atoms; and k indicates an integer of 1~4.

10. The method for negative image recording according to claim 9 wherein said polymer (B) is a polymer of (1) and is a random polymer.

11. The method for negative image recording according to claim 9 wherein said polymer (B) is a polymer of (3) and a constituent atom of said heterocyclic ring is a nitrogen atom, an oxygen atom, or a silicon atom.

12. The method for negative image recording according to claim 9 wherein said polymer (B) is a polymer of (3) and said heterocyclic ring is an aromatic heterocyclic ring having two or more conjugated double bonds.

13. The method for negative image recording of claim 9 wherein said polymer (B) is a polymer of (3), and is represented by the following general formula (4):

general formula (4)

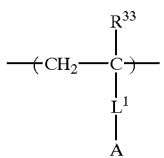

wherein $R^{33}$ represents a hydrogen atom or methyl group; $L^1$ represents a single bond, an ester bond, a carboxylic acid amide bond, a sulfonic acid amide bond, an ether bond, a thioether bond or a divalent organic group having 20 or fewer carbon atoms which may contain these couplings; and A represents a heterocyclic group.

14. The method for negative image recording of claim 13 wherein the polymer having structural units represented by said general formula (4) is a polymer having structural units represented by the following general formulas (6)~(8):

general formula (6)

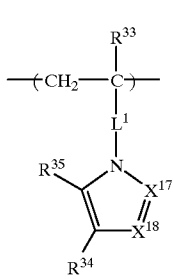

general formula (7)

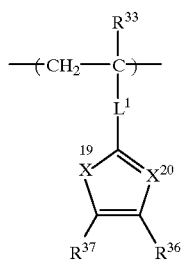

general formula (8)

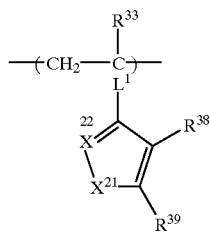

wherein $R^{34}$, $R^{35}$, $R^{36}$, $R^{37}$, $R^{38}$ and $R^{39}$ respectively represent a hydrogen atom or organic groups having 20 or fewer carbon atoms, which may contain substituent group; these organic groups may contain the hetero atoms of nitrogen atoms, oxygen atoms, or sulfur atoms; the substituent groups maybe halogen atoms, alkoxy groups having 10 or fewer carbon atoms, or aryloxy groups having 10 or fewer carbon atoms; $R^{34}$ and $R^{35}$, $R^{36}$ and $R^{37}$, and $R^{38}$ and $R^{39}$ may respectively couple to form a fused ring structure; $X^{17}$ and $X^{18}$ may be the same or different and represent a nitrogen atom or —$CR^{40}$, where $R^{40}$ represents a hydrogen atom or a hydrocarbon group having 20 or fewer carbon atoms; $X^{19}$ represents —$NR^{41}$, an oxygen atom, or a sulfur atom, where $R^{41}$ represents a hydrogen atom or a hydrocarbon group having 20 or fewer carbon atoms; $X^{20}$ represents a nitrogen atom or —$CR^{42}$, where $R^{42}$ represents a hydrogen atom or a hydrocarbon group of having 20 or fewer carbon atoms; $X^{21}$ represents —$NR^{43}$, an oxygen atom, or a sulfur atom, where $R^{43}$ represents a hydrogen atom or a hydrocarbon group having 20 or fewer carbon atoms; and $X^{22}$ represents a nitrogen atom or —$CR^{44}$, where $R^{44}$ represents a hydrogen atom or a hydrocarbon group having 20 or fewer carbon atoms.

15. The method for negative image recording according to claim 9 wherein said polymer (B) is a polymer of (1), and is a radically polymerized polymer.

* * * * *